(12) United States Patent
Du et al.

(10) Patent No.: US 12,453,256 B2
(45) Date of Patent: Oct. 21, 2025

(54) DISPLAY PANEL AND DISPLAY DEVICE

(71) Applicants: Chengdu BOE Optoelectronics Technology Co., Ltd., Sichuan Province (CN); BOE Technology Group Co., Ltd., Beijing (CN)

(72) Inventors: Mengmeng Du, Beijing (CN); Xiangdan Dong, Beijing (CN); Yixiang Yang, Beijing (CN); Junxi Wang, Beijing (CN); Bo Zhang, Beijing (CN); Jiping Zhao, Beijing (CN)

(73) Assignees: Chengdu BOE Optoelectronics Technology Co., Ltd., Sichuan Province (CN); BOE Technology Group Co., Ltd., Beijing (CN)

( * ) Notice: Subject to any disclaimer, the term of this patent is extended or adjusted under 35 U.S.C. 154(b) by 604 days.

(21) Appl. No.: 17/759,708

(22) PCT Filed: Mar. 18, 2020

(86) PCT No.: PCT/CN2020/080080
§ 371 (c)(1),
(2) Date: Jul. 28, 2022

(87) PCT Pub. No.: WO2021/184275
PCT Pub. Date: Sep. 23, 2021

(65) Prior Publication Data
US 2023/0073626 A1  Mar. 9, 2023

(51) Int. Cl.
*H10K 59/131* (2023.01)
*H10K 59/65* (2023.01)

(52) U.S. Cl.
CPC ........... *H10K 59/131* (2023.02); *H10K 59/65* (2023.02)

(58) Field of Classification Search
CPC .... H10K 59/131; H10K 59/65; H10D 86/411; H10D 86/441; H10D 86/60
See application file for complete search history.

(56) References Cited

U.S. PATENT DOCUMENTS

| 2019/0121211 A1* | 4/2019 | Luo | G09G 3/3208 |
| 2020/0212135 A1* | 7/2020 | Zhang | G09G 3/3258 |

* cited by examiner

*Primary Examiner* — Mohammad A Rahman
(74) *Attorney, Agent, or Firm* — Workman Nydegger

(57) ABSTRACT

Disclosed are a display panel and a display device. In the display panel, at least one first data connection portion is respectively electrically connected to at least one data line and at least one first data transmission line through a first data via hole; at least one row of first-type sub-pixels corresponds to at least one first data connection portion; for a first scanning line and the first data connection portion corresponding to the same row of sub-pixels, and the first data line and the first data transmission line electrically connected through the first data connection portion, the orthographic projections of the first data connection portion and the first scanning line have an overlapping area, and the orthographic projections of the first data line and the first data transmission line are not overlapped with the orthographic projection of the first scanning line.

20 Claims, 24 Drawing Sheets

500

DISPLAY PANEL AND DISPLAY DEVICE

CROSS REFERENCE TO RELATED APPLICATIONS

The present disclosure is a US National Stage of International Application No. PCT/CN2020/080080, filed on Mar. 18, 2020, the entire contents of which are incorporated herein by reference.

FIELD

Embodiments of the present disclosure relate to the field of display, in particular to a display panel and a display device.

BACKGROUND

Electroluminescent diodes such as organic light emitting diodes (OLED), quantum dot light emitting diodes (QLED) and micro light emitting diodes (micro LED) have the advantages of self-illumination, low energy consumption and the like, and are one of hotspots in the current application research field of electroluminescent display devices.

SUMMARY

A display panel provided by an embodiment of the present disclosure, includes: a base substrate, including a notch region, a display region and a first non-display region, the first non-display region being located between the notch region and the display region; wherein the display region further includes a plurality of sub-pixels; a third conductive layer, located on the base substrate, and including a plurality of first scanning lines and a plurality of second scanning lines located in the display region; wherein one row of sub-pixels corresponds to one first scanning line and one second scanning line; a second insulating layer, located on a side of the third conductive layer facing away from the base substrate; a first conductive layer, located on a side of the second insulating layer facing away from the base substrate, and including a plurality of data lines and a plurality of first data transmission lines; an interlayer insulating layer, located on a side of the first conductive layer facing away from the base substrate, and having a plurality of first data via holes; and a second conductive layer, located on a side of the interlayer insulating layer facing away from the base substrate, and including a plurality of first data connection portions; wherein the plurality of data lines are located in the display region, and the plurality of first data transmission lines are located in the first non-display region; at least one of the plurality of first data connection portions is electrically connected with at least one of the plurality of data lines and at least one of the plurality of first data transmission lines through the first data via holes; rows of sub-pixels include rows of first-type sub-pixels; at least one row of sub-pixels in the rows of first-type sub-pixels corresponds to at least one first data connection portion; and for a first scanning line and a first data connection portion corresponding to a same row of sub-pixels, and a first data line and a first data transmission line electrically connected through the first data connection portion, an orthographic projection of the first data connection portion on the base substrate and an orthographic projection of the first scanning line on the base substrate have an overlapping area, and an orthographic projection of the first data line on the base substrate and an orthographic projection of the first data transmission line on the base substrate are not overlapped with the orthographic projection of the first scanning line on the base substrate.

Optionally, in the embodiments of the present disclosure, the second conductive layer further includes: a plurality of second data transmission lines disposed spaced from the first data connection portions; the plurality of second data transmission lines are located in the first non-display region; the interlayer insulating layer further includes: a plurality of second data via holes; and the plurality of data lines include a plurality of first data lines and a plurality of second data lines; wherein one first data line is electrically connected with one first data transmission line through the first data connection portion, and one second data line is electrically connected with one second data transmission line through a second data via hole.

Optionally, in the embodiments of the present disclosure, a second scanning line corresponding to a first row of sub-pixels in every two adjacent rows of sub-pixels is electrically connected to a first scanning line corresponding to a second row of sub-pixels in the every two adjacent rows of sub-pixels.

Optionally, in the embodiments of the present disclosure, the first conductive layer further includes: a plurality of first scanning connection portions insulated from the data lines and the first data transmission lines and disposed at intervals; wherein the first scanning lines and the second scanning lines electrically connected with each other correspond to at least one of the plurality of first scanning connection portions; the second insulating layer includes a plurality of first scanning via holes and a plurality of second scanning via holes; and a first end of a first scanning connection portion is electrically connected to a corresponding first scanning line through at least one of the plurality of first scanning via holes, and a second end of the first scanning connection portion is electrically connected to a corresponding second scanning line through at least one of the plurality of second scanning via holes.

Optionally, in the embodiments of the present disclosure, the orthographic projection of the first data connection portion on the base substrate and an orthographic projection of the first scanning connection portion on the base substrate are not overlapped.

Optionally, in the embodiments of the present disclosure, for a first scanning line, a second scanning line and a first data connection portion corresponding to a same row of sub-pixels, an orthographic projection of the first data connection portion on the base substrate is located between an orthographic projection of a first scanning via hole corresponding to the first scanning line on the base substrate and an orthographic projection of a second scanning via hole corresponding to the second scanning line on the base substrate.

Optionally, in the embodiments of the present disclosure, for the first scanning line, the second scanning line and the first data connection portion corresponding to the same row of sub-pixels, a connection line between a center of the orthographic projection of the first scanning via hole corresponding to the first scanning line on the base substrate and a center of the orthographic projection of the second scanning via hole corresponding to the second scanning line on the base substrate is overlapped with the orthographic projection of the first data connection portion on the base substrate.

Optionally, in the embodiments of the present disclosure, for the first scanning line and the first data connection portion corresponding to the same row of sub-pixels, an orthographic projection of a center region of the first data connection portion on the base substrate and the orthographic projection of the first scanning line on the base substrate have an overlapping area.

Optionally, in the embodiments of the present disclosure, a part of rows of sub-pixels in the rows of first-type sub-pixels correspond to two first data connection portions, and for a first scanning line, a second scanning line and the two first data connection portions corresponding to a same row of sub-pixels, orthographic projections of the two first data connection portions on the base substrate and an orthographic projection of the first scanning line on the base substrate have an overlapping area, and the orthographic projections of the two first data connection portions on the base substrate is not overlapped with an orthographic projection of the second scanning line on the base substrate.

Optionally, in the embodiments of the present disclosure, for the first scanning line, the second scanning line and the two first data connection portions corresponding to the same row of sub-pixels, an orthographic projection of a first one of the two first data connection portions on the base substrate is close to an orthographic projection of a first scanning via hole corresponding to the first scanning line on the base substrate; and/or, an orthographic projection of a second one of the two first data connection portions on the base substrate is close to an orthographic projection of a second scanning via hole corresponding to the second scanning line on the base substrate.

Optionally, in the embodiments of the present disclosure, the second conductive layer further includes: a plurality of second data connection portions; wherein one second data transmission line is directly electrically connected to at least one of the plurality of second data connection portions, and the second data connection portion is electrically connected to one second data line through a second data via hole.

Optionally, in the embodiments of the present disclosure, in a first direction, the first data lines and the second data lines are arranged alternately; and projections of the first data connection portions and the second data connection portions on a straight line extending in the first direction are arranged alternately.

Optionally, in the embodiments of the present disclosure, the rows of sub-pixels include rows of second-type sub-pixels; the rows of second-type sub-pixels are different from the rows of first-type sub-pixels; at least one row of sub-pixels in the rows of second-type sub-pixels corresponds to at least one second data connection portion; and for a first scanning line and a second data connection portion corresponding to a same row of sub-pixels, and a second data line and a second data transmission line electrically connected through the second data connection portion, an orthographic projection of the second data connection portion on the base substrate and an orthographic projection of the first scanning line on the base substrate have an overlapping area, and an orthographic projection of the second data line on the base substrate and an orthographic projection of the second data transmission line on the base substrate are not overlapped with the orthographic projection of the first scanning line on the base substrate.

Optionally, in the embodiments of the present disclosure, for a row of sub-pixels corresponding to two first data connection portions, the row of sub-pixels further corresponds to one second data connection portion; and for the first scanning line and the second data connection portion corresponding to the same row of sub-pixels, and the second data line and the second data transmission line electrically connected through the second data connection portion, the orthographic projection of the second data connection portion on the base substrate and the orthographic projection of the first scanning line on the base substrate have an overlapping area, and the orthographic projection of the second data line on the base substrate and an orthographic projection of the second data transmission line on the base substrate are not overlapped with the orthographic projection of the first scanning line on the base substrate.

Optionally, in the embodiments of the present disclosure, the third conductive layer further includes a plurality of light emitting control lines located in the display region; wherein one row of sub-pixels corresponds to one light emitting control line; light emitting control lines corresponding to two adjacent rows of sub-pixels are electrically connected; the display panel further includes: a fourth conductive layer, located between the first conductive layer and the third conductive layer; and the second insulating layer includes: a second gate insulating layer, located between the third conductive layer and the fourth conductive layer; and an interlayer dielectric layer, located between the fourth conductive layer and the first conductive layer.

Optionally, in the embodiments of the present disclosure, the first conductive layer further includes: a plurality of first light emitting connection portions insulated from the data lines and the first data transmission lines and disposed at intervals; wherein light emitting control lines electrically connected with each other correspond to at least one first light emitting connection portion; the second insulating layer includes a plurality of first light emitting via holes and a plurality of second light emitting via holes; and a first end of a first light emitting connection portion is electrically connected to a corresponding light emitting control line through at least one of the plurality of first light emitting via holes, and a second end of the first light emitting connection portion is electrically connected to an another corresponding light emitting control line through at least one of the plurality of second light emitting via holes.

Optionally, in the embodiments of the present disclosure, the third conductive layer further includes a plurality of first scanning transmission lines and a plurality of first light emitting transmission lines located in the first non-display region; wherein the first scanning transmission lines and the first light emitting transmission lines are disposed at intervals; a part of the first scanning lines and the second scanning lines electrically connected with each other are directly electrically connected with one corresponding first scanning transmission line; a part of light emitting control lines electrically connected with each other are directly electrically connected to one first light emitting transmission line; the fourth conductive layer further includes a plurality of second scanning transmission lines and a plurality of second light emitting transmission lines located in the first non-display region; wherein the second scanning transmission lines and the second light emitting transmission lines are disposed at intervals; the interlayer dielectric layer further includes a plurality of third scanning via holes and a plurality of third light emitting via holes; a remaining part of the first scanning lines and the second scanning lines electrically connected with each other correspond to one second scanning transmission line, and the first scanning connection portions are further electrically connected to the second scanning transmission line through the third scanning via holes; and a remaining part of the light emitting control lines electrically connected with each other correspond to one second light emitting transmission line, and the first light emitting connection portions are further electrically connected to the second light emitting transmission line through the third light emitting via holes.

Optionally, in the embodiments of the present disclosure, the fourth conductive layer includes a plurality of third scanning transmission lines located in the first non-display region; the interlayer dielectric layer includes a plurality of fourth scanning via holes; the first scanning lines and the second scanning lines electrically connected with each other correspond to one third scanning transmission line, and the first scanning connection portions are further electrically connected to the third scanning transmission line through the fourth scanning via holes; and the third conductive layer further includes third light emitting transmission lines located in the first non-display region; wherein light emitting control lines electrically connected with each other are directly electrically connected with one third light emitting transmission line.

Optionally, in the embodiments of the present disclosure, the fourth conductive layer includes a plurality of fourth light emitting transmission lines located in the first non-display region; the interlayer dielectric layer includes a plurality of fourth light emitting via holes; light emitting control lines electrically connected with each other correspond to one fourth light emitting transmission line, and the first light emitting connection portions are further electrically connected to the fourth light emitting transmission line through the fourth light emitting via holes; and the third conductive layer further includes fourth scanning transmission lines located in the first non-display region; wherein the first scanning lines and the second scanning lines electrically connected with each other are directly electrically connected to one fourth scanning transmission line.

Optionally, in the embodiments of the present disclosure, for a light emitting control line, a second scanning line and a second data connection portion corresponding to a same row of sub-pixels, an orthographic projection of the second data connection portion on the base substrate is located between an orthographic projection of a second scanning via hole corresponding to the second scanning line on the base substrate and an orthographic projection of a first light emitting via hole corresponding to the light emitting control line on the base substrate.

Optionally, in the embodiments of the present disclosure, the display panel further includes: a first gate insulating layer, located between the third conductive layer and the base substrate; and a semiconductor layer, located between the first gate insulating layer and the base substrate; wherein at least one of the plurality of sub-pixels includes: a first connection via hole, a second connection via hole and a third connection via hole; wherein the first connection via hole penetrates through the first gate insulating layer, the second gate insulating layer and the interlayer dielectric layer; the second connection via hole penetrates through the second gate insulating layer and the interlayer dielectric layer; and the third connection via hole penetrates through the interlayer dielectric layer; the first conductive layer is electrically connected to the semiconductor layer through the first connection via hole; the first conductive layer is electrically connected to the second conductive layer through the second connection via hole; and the first conductive layer is electrically connected to the third conductive layer through the third connection via hole.

Optionally, in the embodiments of the present disclosure, the display panel further includes at least one first auxiliary via hole located in the first non-display region; wherein the first auxiliary via hole penetrates through the first gate insulating layer, the second gate insulating layer and the interlayer dielectric layer, and the first auxiliary via hole is not filled with a conductive material.

Optionally, in the embodiments of the present disclosure, a distribution density of the first auxiliary via holes is smaller than or substantially equal to a distribution density of the first connection via holes.

Optionally, in the embodiments of the present disclosure, an orthographic projection of the first auxiliary via hole on the base substrate is not overlapped with orthographic projections of the semiconductor layer, the first conductive layer, the third conductive layer and the fourth conductive layer on the base substrate.

Optionally, in the embodiments of the present disclosure, the display panel further includes at least one second auxiliary via hole located in the first non-display region; wherein the second auxiliary via hole penetrates through the second gate insulating layer and the interlayer dielectric layer, and the second auxiliary via hole is not filled with a conductive material.

Optionally, in the embodiments of the present disclosure, a distribution density of the second auxiliary via holes is smaller than or substantially equal to a distribution density of the second connection via holes.

Optionally, in the embodiments of the present disclosure, an orthographic projection of the second auxiliary via hole on the base substrate is not overlapped with orthographic projections of the first conductive layer, the third conductive layer and the fourth conductive layer on the base substrate.

Optionally, in the embodiments of the present disclosure, the display panel further includes at least one third auxiliary via hole located in the first non-display region; wherein the third auxiliary via hole penetrates through the interlayer dielectric layer, and the third auxiliary via hole is not filled with a conductive material.

Optionally, in the embodiments of the present disclosure, a distribution density of the third auxiliary via holes is smaller than or substantially equal to a distribution density of the third connection via holes.

Optionally, in the embodiments of the present disclosure, an orthographic projection of the third auxiliary via hole on the base substrate is not overlapped with orthographic projections of the first conductive layer and the fourth conductive layer on the base substrate.

A display device further provided by an embodiment of the present disclosure, includes the above display panel.

DETAILED DESCRIPTION OF THE EMBODIMENTS

Figure 1:
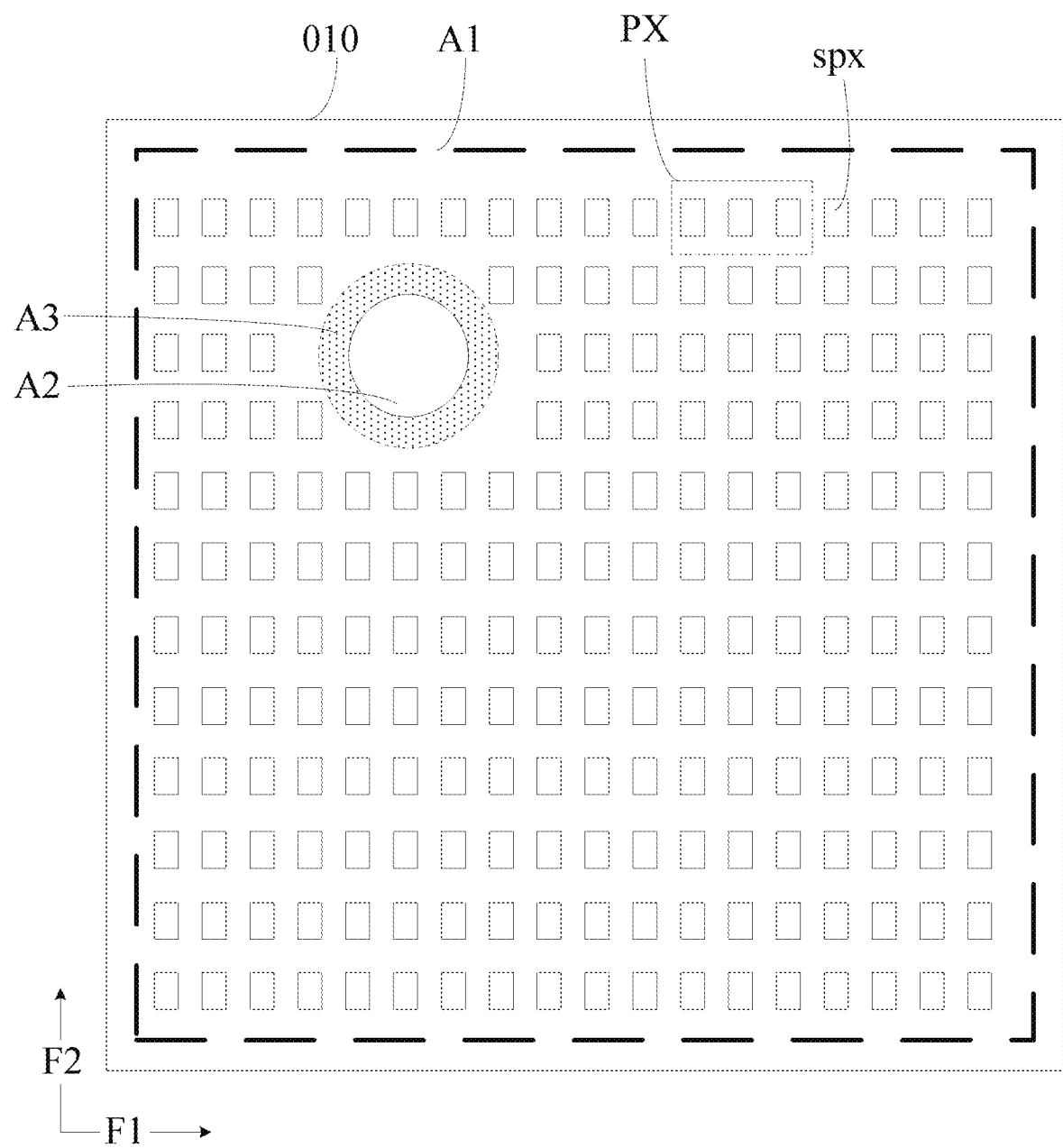
FIG. 1 is a schematic structural diagram of some display panels provided by an embodiment of the present disclosure.

In make the objectives, technical solutions and advantages of embodiments of the present disclosure clearer, the technical solutions of the embodiments of the present disclosure will be clearly and completely described below in conjunction with the accompanying drawings of the embodiments of the present disclosure. Apparently, the described embodiments are only a part of the embodiments of the present disclosure, not all of the embodiments. The embodiments in the present disclosure and features in the embodiments can be combined with each other in the case of not conflicting. Based on the described embodiments of the present disclosure, all other embodiments obtained by those of ordinary skill in the art without creative work shall fall within the protection scope of the present disclosure.

Unless otherwise defined, technical or scientific terms used in the present disclosure shall have the ordinary meanings understood by those ordinarily skilled in the art to which the present disclosure pertains. The words "first", "second" and the like used in the present disclosure do not indicate any order, quantity or importance, but are only configured to distinguish different components. The words "comprise" or "include" and the like indicate that an element or item appearing before such the word covers listed elements or items appearing after the word and equivalents thereof, and does not exclude other elements or items. The words "connect" or "couple" or the like are not limited to physical or mechanical connection, but may include electrical connection, whether direct or indirect.

It needs to be noted that the sizes and shapes of all figures in the accompanying drawings do not reflect true scales, and are only intended to schematically illustrate the content of the present disclosure. The same or similar reference numerals represent the same or similar elements or elements with the same or similar functions all the time.

With the development of display technologies, full screens have attracted extensive attention because of their large screen-to-body ratios and ultra narrow bezels, and compared with ordinary display screens, the visual effect for viewers can be greatly improved. Generally, in a display device such as a mobile phone with a full screen, in order to realize selfie and call functions, a front camera, a receiver, etc., are usually disposed on the front of the display device. Generally, a display panel is provided with a notch region A2 for disposing the front camera, the receiver and other devices. However, due to the existence of the notch region A2, a scanning line and a data line need to be wound according to the notch region A2, which leads to coupling between the scanning line and the data line, resulting in signal interference and affecting the display effect.

In view of this, an embodiment of the present disclosure provides a display panel, which can reduce the coupling between the scanning line and the data line, reduce the signal interference and improve the display effect.

As shown in FIG. 1, a display panel provided by the embodiment of the present disclosure may include: a base substrate 010. The base substrate 010 may include a notch region A2, a display region A1 and a first non-display region A3. The first non-display region A3 is located between the notch region A2 and the display region A1. The base substrate 010 may be a glass substrate, a flexible substrate, or a silicon substrate, etc., which is not limited here. When the display panel is applied to a display device, a camera, a receiver and other devices are generally disposed, so that the notch region A2 may be a hollowed-out region of the base substrate 010 in order to dispose the camera, the receiver and other devices. For example, in an actual preparation process, a position, corresponding to the notch region A2, in the base substrate 010 is dug in a cutting mode to form the hollowed-out region so as to be used for disposing the camera, the receiver and other devices in the display device. Alternatively, the base substrate 010 may not be cut, instead, a position corresponding to the notch region A2 is made to be a transparent region by avoiding lines on the base substrate 010 to form the notch region A2.

In practical applications, the display panel generally may further include a bezel region surrounding the display region A1. An electrostatic releasing circuit, a gate driving circuit and other elements may be disposed in the bezel region. Of course, the display panel may also not be provided with the bezel region, these can be designed and determined according to the requirements of the practical application environment, which is not limited here.

During specific implementation, in the embodiments of the present disclosure, as shown in FIG. 1, the display region A1 may further include a plurality of pixel units PX distributed in an array. Each pixel unit PX may include a plurality of sub-pixels spx. The sub-pixels spx may be distributed in the display region A1 in an array. Exemplarily, in combination with FIG. 1 and FIG. 2, the sub-pixels spx may include: pixel driving circuits 0121 and light emitting devices 0120. The pixel driving circuits 0121 have transistors and capacitors, electric signals are generated by interaction of the transistors and the capacitors, and the generated electric signals are input to first light emitting electrodes of the light emitting devices 0120. Loading corresponding voltages to second light emitting electrodes of the light emitting devices 0120 may drive the light emitting devices 0120 to emit light.

Figure 2:
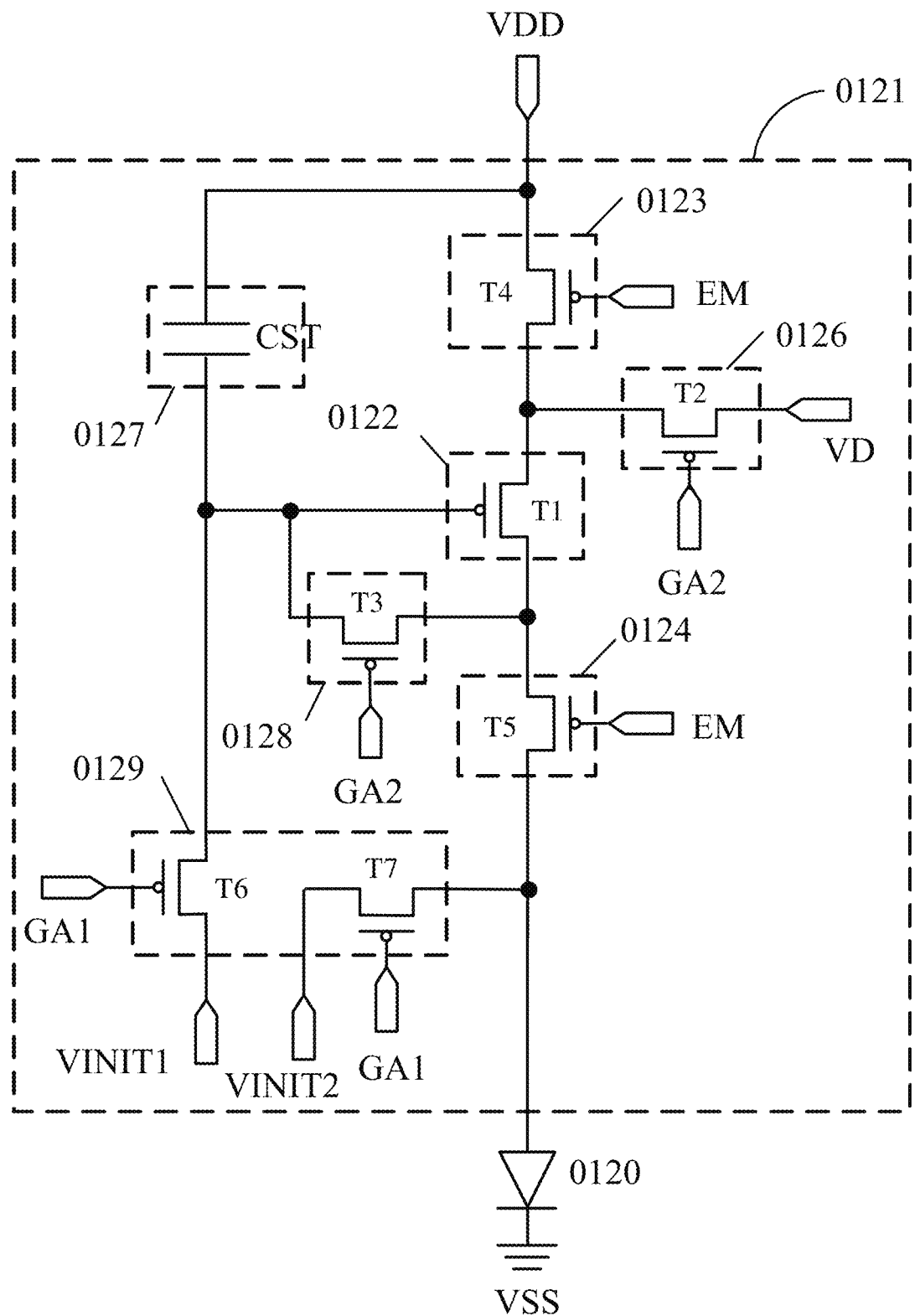
FIG. 2 is a schematic structural diagram of a circuit in some sub-pixels provided by an embodiment of the present disclosure.

In combination with FIG. 2, a pixel driving circuit 0121 may include: a driving control circuit 0122, a first light emitting control circuit 0123, a second light emitting control circuit 0124, a data writing circuit 0126, a storage circuit 0127, a threshold compensation circuit 0128 and a reset circuit 0129.

Each driving control circuit 0122 may include a control end, a first end and a second end. The driving control circuit 0122 is configured to provide a driving current to a light emitting device 0120 to drive the light emitting device 0120 to emit light. For example, the first light emitting control circuit 0123 is connected to the first end and a first voltage end VDD of the driving control circuit 0122. The driving control circuit 0122 is configured to realize connection or disconnection between the driving control circuit 0122 and the first voltage end VDD.

The second light emitting control circuit 0124 is electrically connected to the second end of the driving control circuit 0122 and a first light emitting electrode of the light emitting device 0120. The second light emitting control circuit 0124 is configured to realize connection or disconnection between the driving control circuit 0122 and the light emitting device 0120.

The data writing circuit 0126 is electrically connected to the first end of the driving control circuit 0122. The second light emitting control circuit 0124 is configured to write a signal on a data line VD into the storage circuit 0127 under the control of a signal on a scanning line GA2.

The storage circuit 0127 is electrically connected to the control end and the first voltage end VDD of the driving control circuit 0122. The storage circuit 0127 is configured to store data signals.

The threshold compensation circuits 0128 is electrically connected to the control end and the second end of the driving control circuit 0122. The threshold compensation circuit 0128 is configured to perform threshold compensation on the driving control circuit 0122.

The reset circuit 0129 is electrically connected to the control end of the driving control circuit 0122 and the first light emitting electrode of the light emitting device 0120. The reset circuit 0129 is configured to reset the control end of the driving control circuit 0122 and the first light emitting electrode of the light emitting device 0120 under the control of a signal on a gate line GA1.

Each light emitting device 0120 may include a first light emitting electrode, a light emitting function layer and a second light emitting electrode which are disposed in a laminated mode. Exemplarily, the first light emitting electrode may be an anode, and the second light emitting electrode may be a cathode. The light emitting function layer may include light an emitting layer. Further, the light emitting function layer may also include a hole injection layer, a hole transport layer, a light emitting layer, an electron transport layer, an electron injection layer and other film layers. Of course, in practical applications, the light emitting device 0120 may be designed and determined according to the requirements of the practical application environment, which is not limited here.

Exemplarily, in combination with FIG. 2, each driving control circuit 0122 includes: a driving transistor T1. A control end of the driving control circuit 0122 includes a gate electrode of the driving transistor T1, a first end of the driving control circuit 0122 includes a first electrode of the driving transistor T1, and a second end of the driving control circuit 0122 includes a second electrode of the driving transistor T1.

Exemplarily, in combination with FIG. 2, a data writing circuit 0126 includes a data writing transistor T2. A storage circuit 0127 includes a storage capacitor CST. A threshold compensation circuit 0128 includes a threshold compensation transistor T3. A first light emitting control circuit 0123 includes a first light emitting control transistor T4. A second light emitting control circuit 0124 includes a second light emitting control transistor T5. A reset circuit 0129 includes a first reset transistor T6 and a second reset transistor T7.

Specifically, a first electrode of a data writing transistor T2 is electrically connected to a first electrode of a driving transistor T1, a second electrode of the data writing transistor T2 is electrically connected to a data line VD to receive a data signal, and a gate electrode of the data writing transistor T2 is electrically connected to a second scanning line GA2 to receive a scanning signal.

A first electrode of a storage capacitor CST is electrically connected to a first power end VDD, and a second electrode of the storage capacitor CST is electrically connected to the gate electrode of the driving transistor T1.

A first electrode of a threshold compensation transistor T3 is electrically connected to the second electrode of the driving transistors T1, a second electrode of the threshold compensation transistor T3 is electrically connected to the gate electrode of the driving transistor T1, and a gate electrode of the threshold compensation transistor T3 is electrically connected to a second scanning line GA2 to receive a compensation control signal.

A first electrode of a first reset transistors T6 is electrically connected to a first reset signal line VINIT1 to receive a first reset signal, a second electrode of the first reset transistor T6 is electrically connected to the gate electrode of the driving transistor T1, and a gate electrode of the first reset transistor T6 is electrically connected to a first scanning line GA1 to receive a control signal.

A first electrode of a second reset transistor T7 is electrically connected to a second reset signal line VINIT2 to receive a second reset signal, a second electrode of the second reset transistor T7 is electrically connected to a first light emitting electrode of a light emitting device 0120, and a gate electrode of the second reset transistor T7 is electrically connected to a first scanning line GA1 to receive a control signal.

A first electrode of a first light emitting control transistor T4 is electrically connected to a first power end VDD, a second electrode of the first light emitting control transistor T4 is electrically connected to the first electrode of the driving transistor T1, and a gate electrode of the first light emitting control transistor T4 is electrically connected to a light emitting control line EM.

A first electrode of a second light emitting control transistor T5 is electrically connected to the second electrode of the driving transistor T1, a second electrode of the second light emitting control transistor T5 is electrically connected to the first light emitting electrode of the light emitting device 0120, and a gate electrode of the second light emitting control transistor T5 is electrically connected to a light emitting control line EM to receive a light emitting control signal.

A second light emitting electrode of the light emitting device 0120 is electrically connected to a second power end VSS. The first electrode and the second electrode of the above transistors can be determined as source electrodes or drain electrodes according to practical applications, which is not limited here.

Exemplarily, one of the first power end VDD and the second power end VSS is a high-voltage end, and the other one is a low-voltage end. For example, in the embodiment as shown in FIG. 2, the first power end VDD is a voltage source to output a constant first voltage which is a positive voltage, while the second power end VSS may be a voltage source to output a constant second voltage which is a negative voltage. For example, in some examples, the second power end VSS may be grounded.

It needs to be noted that, in the embodiments of the present disclosure, the pixel driving circuits in the sub-pixels spx may also be structures including other quantities of transistors other than the structure shown in FIG. 2, which is not limited in the embodiments of the present disclosure.

Figure 3:
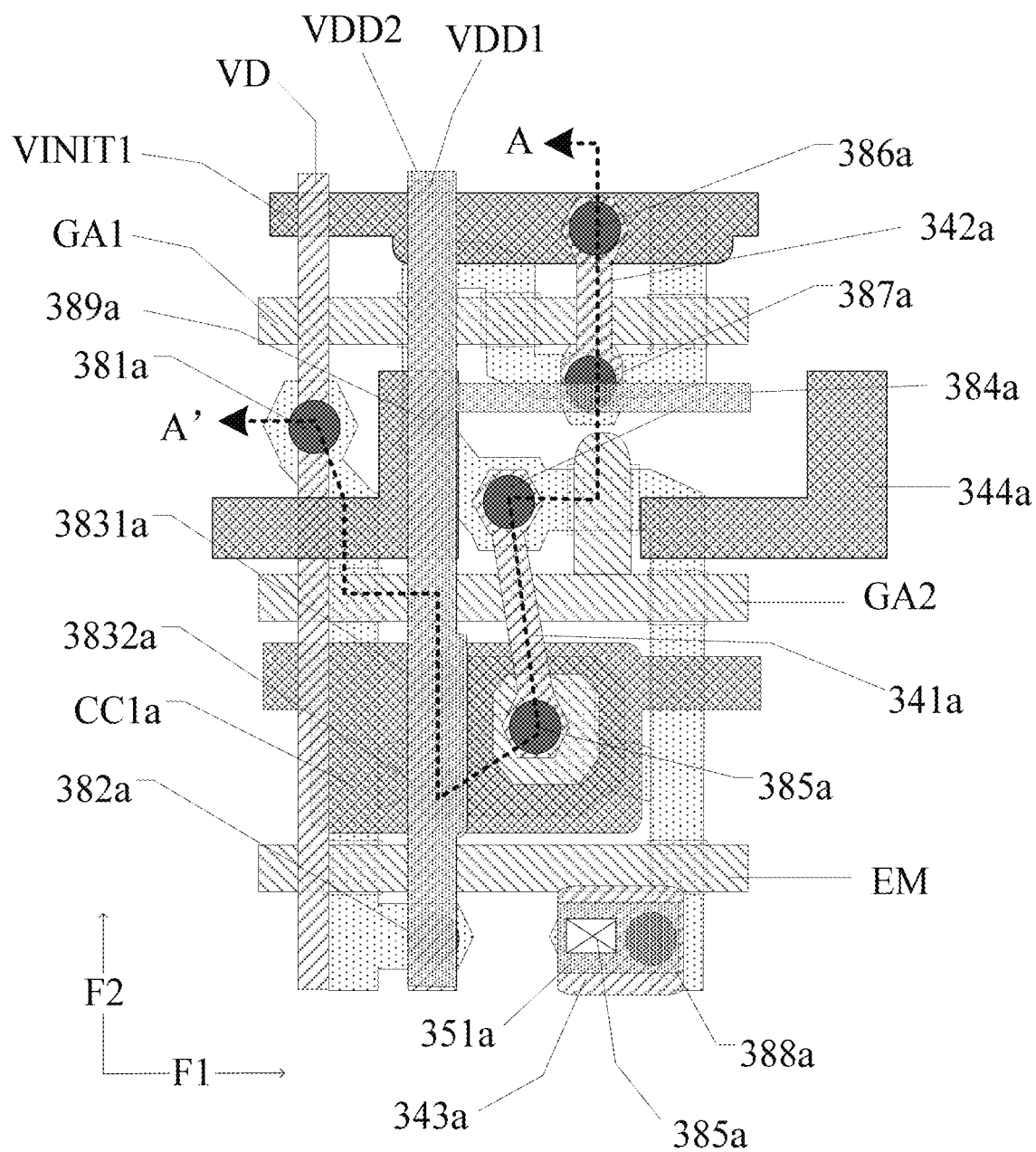
FIG. 3 is a schematic diagram of a layout structure in some sub-pixels provided by an embodiment of the present disclosure.

FIG. 3 is a schematic diagram of a layout structure of the pixel driving circuit provided by some embodiments of the present disclosure. FIG. 4A to FIG. 4E are schematic diagrams of layers of the pixel driving circuit provided by some embodiments of the present disclosure. The examples shown in FIG. 3 to FIG. 4E take the pixel driving circuit of one sub-pixel spx as an example. FIG. 3 to FIG. 4E further show the first scanning line GA1, the second scanning line GA2, the first reset signal line VINIT1 (the first reset signal line VINIT1 is shown because the first reset signal line VINIT1 and the second reset signal line VINIT2 are the same signal line), the light emitting control line EM, the data line VD, and a first power signal line VDD1 and a second power signal line VDD2 (electrically connected with the first power end VDD) which are electrically connected to the pixel driving circuit 0121. The first power signal line VDD1 and the second power signal line VDD2 are electrically connected with each other.

Figure 4A:
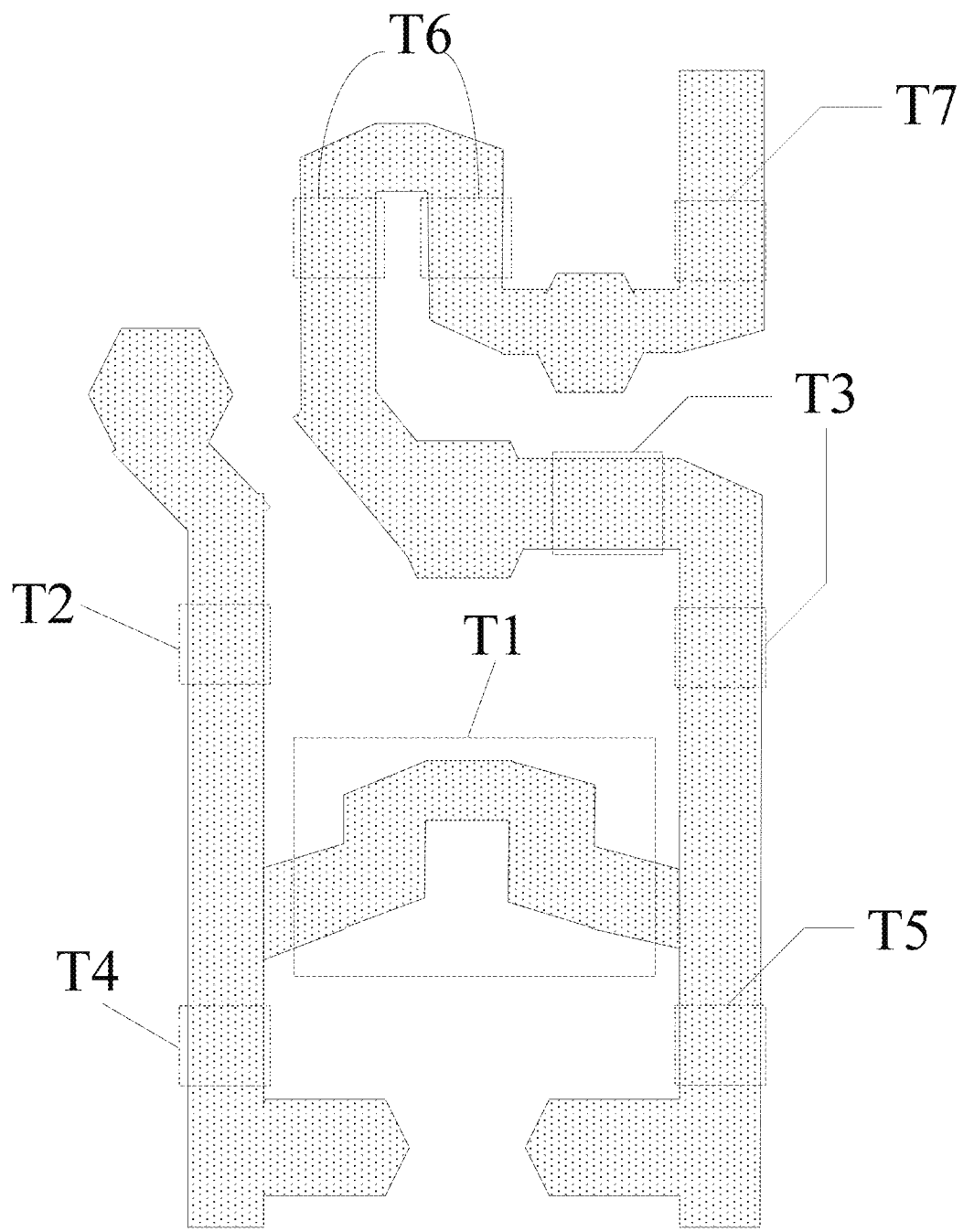
FIG. 4A is a schematic diagram of a layout structure of a semiconductor layer in some sub-pixels provided by an embodiment of the present disclosure.

Exemplarily, as shown in FIG. 3 and FIG. 4A, a semiconductor layer 500 of the pixel driving circuit 0121 is shown. The semiconductor layer 500 may be formed by patterning a semiconductor material. The semiconductor layer 500 may be configured to manufacture active layers of the driving transistor T1, the data writing transistor T2, the threshold compensation transistor T3, the first light emitting control transistor T4, the second light emitting control transistor T5, the first reset transistor T6 and the second reset transistor T7 above, and each active layer may include a source electrode region, a drain electrode region and a channel region between the source electrode region and the drain electrode region. For example, the active layer of each transistor is integrally disposed.

For example, the semiconductor layer 500 may be made from amorphous silicon, polycrystalline silicon and oxide semiconductor materials, etc. It needs to be noted that the source electrode regions and the drain electrode regions above may be regions doped with n-type impurities or p-type impurities.

It needs to be noted that, in the display region A1, the semiconductor layer 500 may be patterned by adopting a composition process. The semiconductor layer 500 that is not patterned will be reserved in the first non-display region A3. The semiconductor layers 500 in the first non-display region A3 and the display region A1 are disposed in a spaced mode. Of course, the present disclosure is not limited to this.

Exemplarily, a first gate insulating layer 610 (not shown) is formed on the semiconductor layer 500 above to protect the semiconductor layer 500 above. As shown in FIG. 3 and FIG. 4A, a third conductive layer 300 of the pixel driving circuit 0121 is shown. The third conductive layer 300 is disposed on the first gate insulating layer 610 so as to be insulated from the semiconductor layer 500. The third conductive layer 300 may include the second electrode CC2a of the storage capacitor CST, the first scanning line GA1, the second scanning line GA2, the light emitting control line EM as well as gate electrodes of the driving transistor T1, the data writing transistor T2, the threshold compensation transistor T3, the first light emitting control transistor T4, the second light emitting control transistor T5, the first reset transistor T6 and the second reset transistor T7.

Figure 4B:
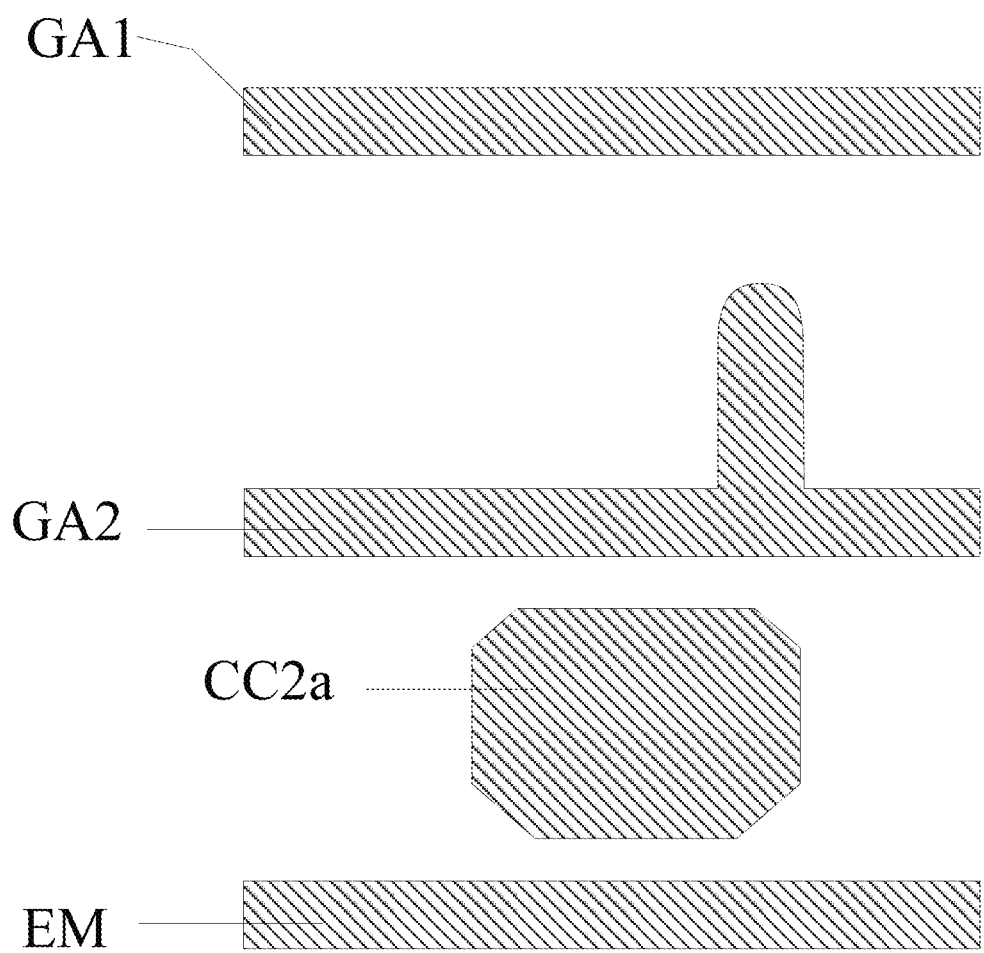
FIG. 4B is a schematic diagram of a layout structure of a third conductive layer in some sub-pixels provided by an embodiment of the present disclosure.

For example, as shown in FIG. 3 to FIG. 4B, the gate electrode of the data writing transistor T2 may be an overlapped portion of the second scanning line GA2 and the semiconductor layer 500, the gate electrode of the first light emitting control transistor T4 may be a first overlapped portion of the light emitting control line EM and the semiconductor layer 500, the gate electrode of the second light emitting control transistor T5 may be a second overlapped portion of the light emitting control line EM and the semiconductor layer 500, the gate electrode of the first reset transistor T6 is a first overlapped portion of the first scanning line GA1 and the semiconductor layer 500, the gate electrode of the second reset transistor T7 is a second overlapped portion of the first scanning line GA1 and the semiconductor layer 500, the threshold compensation transistor T3 may be a thin film transistor with a double-gate structure, the first gate electrode of the threshold compensation transistor T3 may be a first overlapped portion of the second scanning line GA2 and the semiconductor layer 500, and the second gate electrode of the threshold compensation transistor T3 may be a second overlapped portion of a protrusion protruding from the second scanning line GA2 and the semiconductor layer 500. As shown in FIG. 3 and FIG. 4B, the gate electrode of the driving transistor T1 may be the second electrode CC2a of the storage capacitor CST.

It needs to be noted that dashed rectangular boxes in FIG. 4A show all overlapped portions of the third conductive layer 300 and the semiconductor layer 500 in the sub-pixel spx. An active layer of the threshold compensation transistor T3 has a first channel region overlapped with the first gate electrode of the threshold compensation transistor T3, a second channel region overlapped with the second gate electrode of the threshold compensation transistor T3, and a source-drain region located between the first channel region and the second channel region. The source-drain region is configured to electrically connect the first channel region and the second channel region.

Exemplarily, as shown in FIG. 3 and FIG. 4B, the first scanning line GA1, the second scanning line GA2 and the light emitting control line EM are distributed in a second direction F2, and the second scanning line GA2 is located between the first scanning line GA1 and the light emitting control line EM.

Exemplarily, as shown in FIG. 3 and FIG. 4B, in the second direction F2, the second electrode CC2a of the storage capacitor CST is located between the second scanning line GA2 and the light emitting control line EM. The protrusion protruding from the second scanning line GA2 is located on a side of the second scanning line GA2 away from the light emitting control line EM.

Exemplarily, as shown in FIG. 3 and FIG. 4B, in the second direction F2, the gate electrode of the data writing transistor T2, the gate electrode of the threshold compensation transistor T3, the gate electrode of the first reset transistor T6 and the gate electrode of the second reset transistor T7 are all located on a first side of the gate electrode of the driving transistor T1, and the gate electrode of the first light emitting control transistor T4 and the gate electrode of the second light emitting control transistor T5 are both located on a second side of the gate electrode of the driving transistor T1.

For example, in some embodiments, as shown in FIG. 3 and FIG. 4B, in a first direction F1, the gate electrode of the data writing transistor T2 and the gate electrode of the first light emitting control transistor T4 are both located on a third side of the gate electrode of the driving transistor T1, and the first gate electrode of the threshold compensation transistor T3, the gate electrode of the second light emitting control transistor T5 and the gate electrode of the second reset transistor T7 are all located on a fourth side of the gate electrode of the driving transistor T1. The third side and the fourth side of the gate electrode of the driving transistor T1 are two opposite sides, in the first direction F1, of the gate electrode of the driving transistor T1.

Figure 4C:
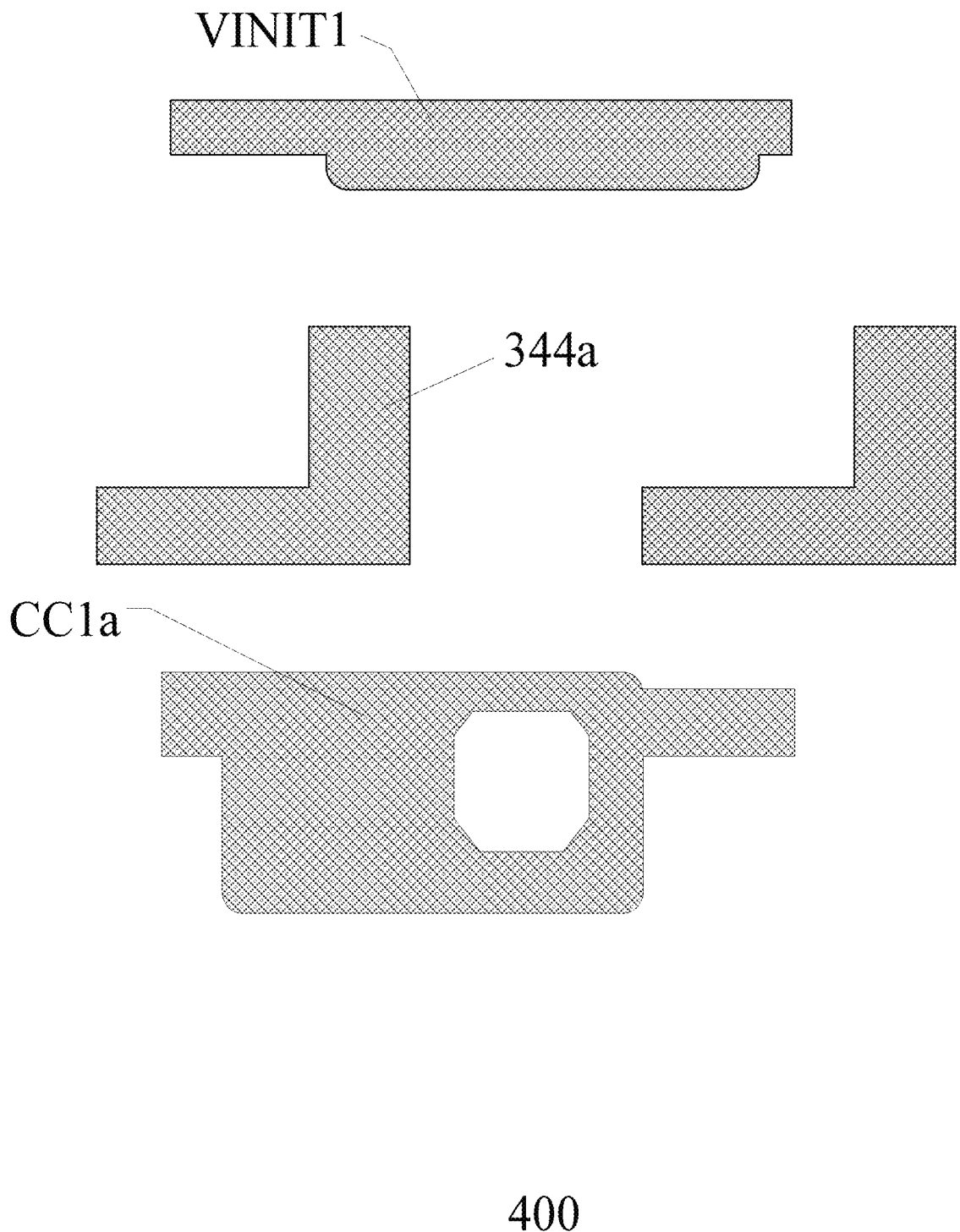
FIG. 4C is a schematic diagram of a layout structure of a fourth conductive layer in some sub-pixels provided by an embodiment of the present disclosure.

Exemplarily, a second gate insulating layer 620 (not shown) is formed on the third conductive layer 300 above to protect the third conductive layer 300 above. As shown in FIG. 3 and FIG. 4C, a fourth conductive layer 400 of the pixel driving circuit 0121 is shown. The fourth conductive layer 400 is disposed on the second gate insulating layer 620. The fourth conductive layer 400 may include: a first electrode CC1a of a storage capacitor CST, a first reset signal line VINIT1 and a shading portion 344a. Exemplarily, an orthographic projection of the first electrode CC1a of the storage capacitor CST on the base substrate 010 and an orthographic projection of a second electrode CC2a of the storage capacitor CST on the base substrate 010 are at least partially overlapped to form the storage capacitor CST. An orthographic projection of the shading portion 344a on the base substrate 010 and an orthographic projection of a source-drain region in an active layer of the threshold compensation transistor T3 on the base substrate 010 have an overlapping area.

Figure 4D:
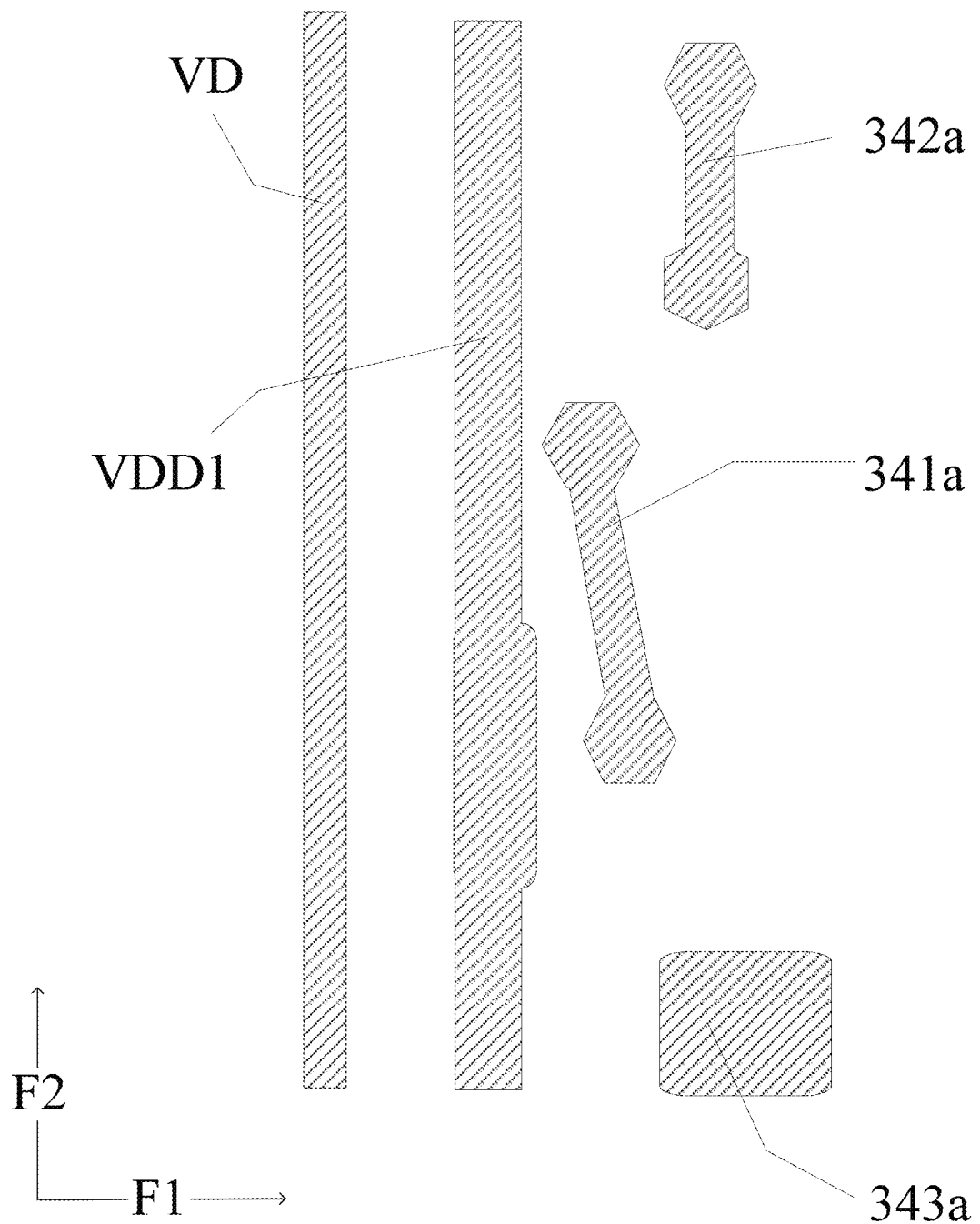
FIG. 4D is a schematic diagram of a layout structure of a first conductive layer in some sub-pixels provided by an embodiment of the present disclosure.
Figure 4E:
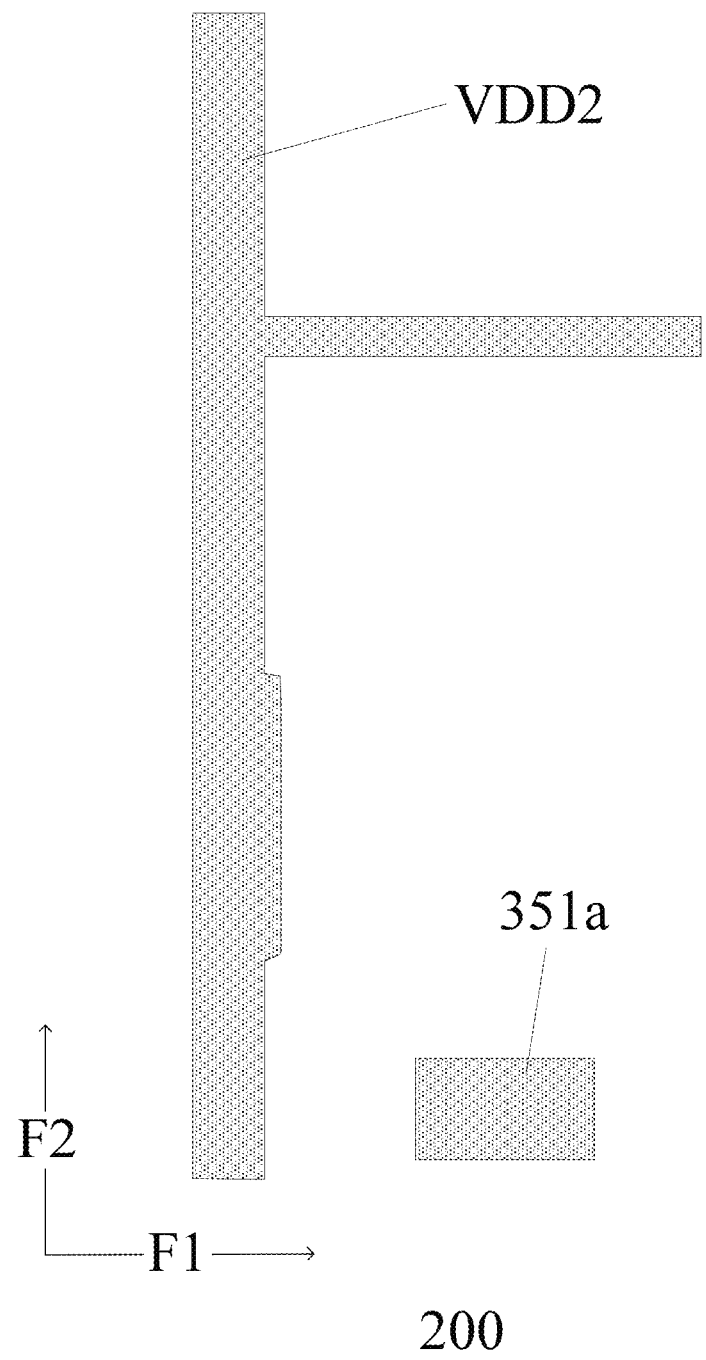
FIG. 4E is a schematic diagram of a layout structure of a second conductive layer in some sub-pixels provided by an embodiment of the present disclosure.

Exemplarily, an interlayer dielectric layer 630 (not shown) is formed on the fourth conductive layer 400 above to protect the fourth conductive layer 400 above. As shown in FIG. 3 and FIG. 4D, a first conductive layer 100 of a pixel driving circuit 0121 is shown, and the first conductive layer 100 is disposed on the interlayer dielectric layer 630. The first conductive layer 100 may include: a data line VD, a first power signal line VDD1 and bridging portions 341a, 342a and 343a.

Exemplarily, an interlayer insulating layer 640 (not shown) is formed on the first conductive layer 100 above to protect the first conductive layer 100 above. As shown in FIG. 3 and FIG. 4E, a second conductive layer 200 of the pixel driving circuit 0121 is shown, and the second conductive layer 200 is disposed on the interlayer insulating layer 640. The second conductive layer 200 includes a second power signal line VDD2 and an adapting portion 351a.

Figure 5:
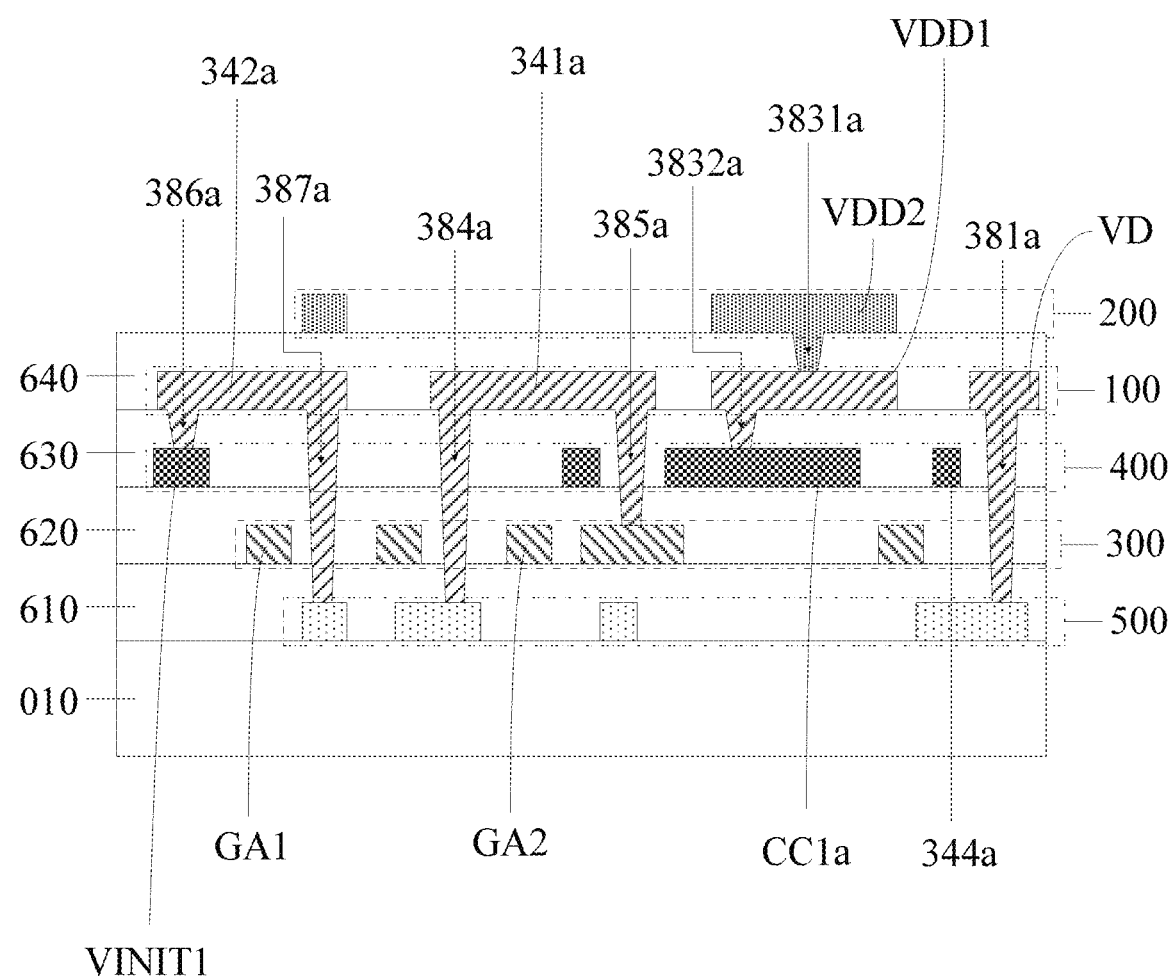
FIG. 5 is a schematic cross-sectional diagram in a direction AA' in the schematic diagram of the layout structure shown in FIG. 3.

FIG. 5 is a schematic cross-sectional diagram in a direction AA' in the schematic diagram of the layout structure shown in FIG. 3. The first gate insulating layer 610 is disposed between the semiconductor layer 500 and the third conductive layer 300, the second gate insulating layer 620 is disposed between the third conductive layer 300 and the fourth conductive layer 400, the interlayer dielectric layer 630 is disposed between the fourth conductive layer 400 and the first conductive layer 100, and the interlayer insulating layer 640 is disposed between the first conductive layer 100 and the second conductive layer 200.

In combination with FIG. 3 and FIG. 5, the sub-pixel spx includes a first connection via hole, a second connection via hole, a third connection via hole and a fourth connection via hole. The first connection via hole penetrates through the first gate insulating layer 610, the second gate insulating layer 620 and the interlayer dielectric layer 630; the second connection via hole penetrates through the second gate insulating layer 620 and the interlayer dielectric layer 630; the third connection via hole penetrates through the interlayer dielectric layer 630; and the fourth connection via hole penetrates through the interlayer insulating layer 640.

Exemplarily, the sub-pixel spx may include first connection via holes 381a, 382a, 384a, 387a and 388a. The sub-pixel spx may include a second connection via hole 385a. The sub-pixel spx may include third connection via holes 386a, 3832a and 389a. The sub-pixel spx includes fourth connection via holes 385a and 3831a. The data line VD is electrically connected to the source electrode region of the data writing transistor T2 in the semiconductor layer 500 through at least one first connection via hole 381a. The first power signal line VDD1 is electrically connected to the source electrode region of a corresponding first light emitting control transistor T4 in the semiconductor layer 500 through at least one first connection via hole 382a. One end of the bridging portion 341a is electrically connected to the drain electrode region of a corresponding threshold compensation transistor T3 in the semiconductor layer 500 through at least one first connection via hole 384a. The other end of the bridging portion 341a is electrically connected to the gate electrode of the driving transistor T1 (i.e., the second electrode CC2a of the storage capacitor CST) in the third conductive layer 300 through at least one second connection via hole 385a. One end of the bridging portion 342a is electrically connected to the first reset signal line VINIT1 through at least one third connection via hole 386a, and the other end of the bridging portion 342a is electrically connected to the drain electrode region of the second reset transistor T7 in the semiconductor layer 500 through at least one first connection via hole 387a. The bridging portion 343a is electrically connected to the drain electrode region of the second light emitting control transistor T5 in the semiconductor layer 500 through at least one first connection via hole 388a. The first power signal line VDD1 is electrically connected to the first electrode CC1a of the storage capacitor CST in the fourth conductive layer 400 through at least one third connection via hole 3832*a*. The first power signal line VDD1 is further electrically connected to the second power signal line VDD2 in the second conductive layer 200 through at least one fourth connection via hole 3831*a*. The adapting portion 351*a* is electrically connected to the bridging portion 343*a* by means of penetrating through at least one fourth connection via hole 385*a*. The first power signal line VDD1 is further electrically connected to the shading portion 344*a* through at least one first connection via hole 389*a* so as to input a fixed voltage to the shading portion 344*a*.

Exemplarily, the first connection via holes 381*a*, 382*a*, 384*a*, 387*a* and 388*a* in the sub-pixel may each be one or two or the like. In practical applications, it can be designed and determined according to requirements of the practical application environment, which is not limited here.

Exemplarily, the second connection via hole 385*a* in the sub-pixel may be one or two or the like. In practical applications, it can be designed and determined according to requirements of the practical application environment, which is not limited here.

Exemplarily, the third connection via holes 386*a*, 3832*a* and 389*a* in the sub-pixel may each be one or two or the like. In practical applications, it can be designed and determined according to requirements of the practical application environment, which is not limited here.

Exemplarily, the fourth connection via holes 385*a* and 3831*a* in the sub-pixel may each be one or two or the like. In practical applications, it can be designed and determined according to requirements of the practical application environment, which is not limited here.

Further, a planarization layer, a layer where the first light emitting electrode is located, a pixel defining layer, a light emitting function layer and a layer where the second light emitting electrode is located are sequentially disposed on one side of the second conductive layer 200 facing away from the base substrate 010. Besides, the first light emitting electrode is electrically connected to the adapting portion 351*a* through a via hole penetrating through the planarization layer.

For example, as shown in FIG. 3 to FIG. 4E, in the second direction F2, the first scanning line GA1, the second scanning line GA2 and the first reset signal line VINIT1 are all located on a first side of the gate electrode of the driving transistor T1, and the light emitting control line EM is located on a second side of the driving transistor T1.

During specific implementation, on the whole display panel, the first power signal line VDD1 is electrically connected to the second power signal line VDD2, so that the signal line electrically connected with the first power end VDD has small resistance and low voltage drop, to thereby improve the stability of a power voltage provided by the first power end VDD.

For example, the first scanning line GA1, the second scanning line GA2 and the light emitting control line EM may be located on the same layer (i.e., the third conductive layer 300). The first power signal line VDD1 and the data line VD are located on the same layer (i.e., the first conductive layer 100).

It needs to be noted that the position distribution relationship of the transistors in each sub-pixel spx is not limited to the example shown in FIG. 3 to FIG. 4E, and the positions of the transistors above may be specifically disposed according to practical application requirements.

It needs to be noted that the first direction F1 may be a row direction of the sub-pixels, and the second direction F2 may be a column direction of the sub-pixels. Alternatively, the first direction F1 may also be a column direction of the sub-pixels, and the second direction F2 is a row direction of the sub-pixels. In practical applications, it can be disposed according to practical application requirements, which is not limited here.

During specific implementation, in the embodiments of the present disclosure, the display region may include a plurality of data lines, a plurality of scanning lines and a plurality of light emitting control lines. The first non-display region may include a plurality of data transmission lines, a plurality of scanning transmission lines and a plurality of light emitting transmission lines. At least one of the plurality of data lines is electrically connected to at least one of the plurality of data transmission lines, at least one of the plurality of scanning lines is electrically connected to at least one of the plurality of scanning transmission lines, and at least one of the plurality of light emitting control lines is electrically connected to at least one of the plurality of light emitting transmission lines.

Figure 6:
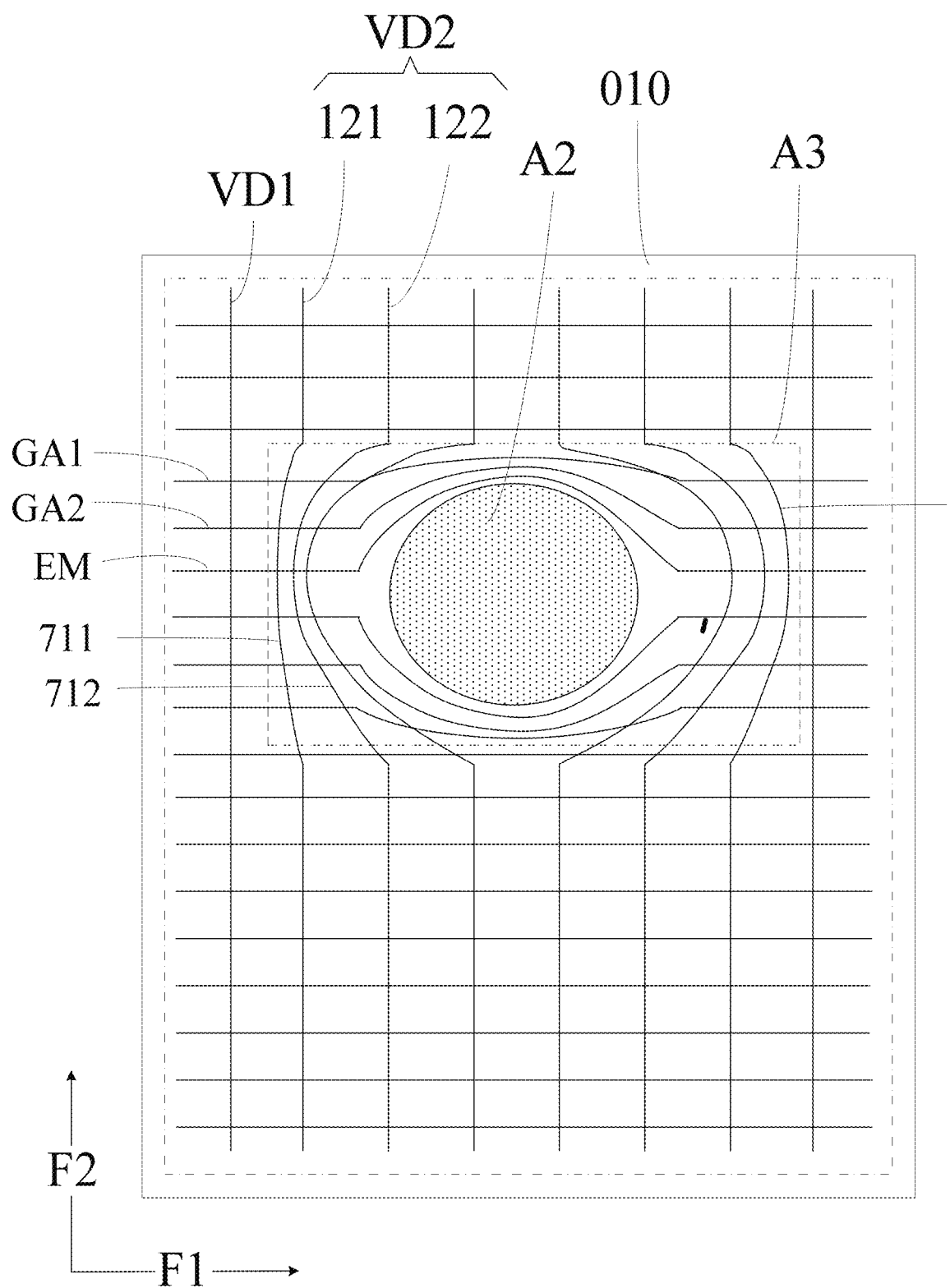
FIG. 6 is a schematic structural diagram of further some display panels provided by an embodiment of the present disclosure.

During specific implementation, in the embodiments of the present disclosure, as shown in FIG. 6, the plurality of data lines in the first conductive layer 100 may include data lines VD1 and data lines VD2. The data lines VD1 and VD2 are both located in the display region A1, and are arranged in the first direction F1. The data lines VD1 extend from the lower side of the display region A1 to the upper side of the display region A1 in the second direction F2, and are arranged in the first direction F1. The data lines VD2 extend in the second direction F2 and are divided by the notch region A2, that is, the data lines VD2 may extend from the lower side of the display region A1 to the first non-display region A3 and may also extend from the upper side of the display region A1 to the first non-display region A3.

During specific implementation, in the embodiments of the present disclosure, as shown in FIG. 6 to FIG. 8A, the first conductive layer 100 may further include: a plurality of first data transmission lines 711 disposed at intervals. The second conductive layer 200 may further include: a plurality of first data connection portions 211 disposed at intervals. The interlayer insulating layer 640 has a plurality of first data via holes. Besides, at least one of the plurality of first data connection portions 211 is electrically connected to at least one of the plurality of data lines VD2 and at least one of the plurality of first data transmission lines 711 through the first data via holes. In this way, the data lines and the first data transmission lines 711 in the first conductive layer 100 are electrically connected with each other through the first data connection portions 211 in the second conductive layer 200. It needs to be noted that the data lines VD2 corresponding to the same column of sub-pixels spx and divided by the notch region A2 may be electrically connected with each other through the first data transmission lines 711 to form one data line for inputting a data signal to the column of sub-pixels spx.

According to the display panel provided by the embodiments of the present disclosure, the first data connection portions 211 are disposed in the second conductive layer 200, so that the data lines VD2 and the first data transmission lines 711 in the first conductive layer 100 are electrically connected with each other by means of the first data connection portions 211 in the second conductive layer 200. In this way, the data lines VD2 corresponding to the same column of sub-pixels spx and divided by the notch region A2 may be electrically connected, and the interference of the first data connection portions 211 on the third conductive layer 300 and the fourth conductive layer 400 may also be reduced, so that the signal stability can be improved, and the display effect can be improved.

Besides, since multiple bridging portions are disposed in the first conductive layer 100, if the first data connection portions 211 are also disposed in the first conductive layer 100, the area in the first conductive layer 100 for disposing the bridging portions, the data lines and the first power signal lines will be reduced, which may leads to the situation of short circuit of the bridging portions, the data lines, the first power signal lines and the first data connection portions 211. Therefore, the display panel provided by the embodiments of the present disclosure may also lower the short circuit risk, thereby further improving the stability of the display panel and improving the competitiveness of the display panel.

During specific implementation, in the embodiments of the present disclosure, as shown in FIG. 6 to FIG. 8A, the plurality of first data transmission lines 711 are located in the first non-display region A3. Exemplarily, the plurality of first data transmission lines 711 may be disposed in an arc surrounding the notch region A2. The interlayer insulating layer 640 may have: a plurality of first data via holes 641-1 and a plurality of first data via holes 641-2. One first data connection portion 211 corresponds to at least one first data via hole 641-1 and at least one first data via hole 641-2. Besides, one end of the first data connection portion 211 may be electrically connected to the data line VD2 through a corresponding first data via hole 641-1, and the other end of the first data connection portion 211 may be electrically connected to the first data transmission line 711 through a corresponding first data via hole 641-2. In practical applications, one first data connection portion 211 may correspond to one or two or three or more first data via holes 641-1. One first data connection portion 211 may also correspond to one or two or three or more first data via holes 641-2. These may be designed and determined according to the requirements of practical applications, which is not limited here.

During specific implementation, in the embodiments of the present disclosure, as shown in FIG. 6 to FIG. 8A, the plurality of data lines VD2 may include a plurality of first data lines 121 and a plurality of second data lines 122. Exemplarily, in the first direction F1, the first data lines 121 and the second data lines 122 may be arranged alternately. For example, in a direction pointed by an arrow of the first direction F1, the odd ones in the plurality of data lines VD2 may serve as the first data lines 121, and the even ones in the plurality of data lines VD2 may serve as the second data lines 122. Of course, the first data lines 121 and the second data lines 122 can also be designed and determined according to the requirements of the practical application environment, which is not limited here.

During specific implementation, in the embodiments of the present disclosure, as shown in FIG. 6 to FIG. 8A, one first data line 121 may be electrically connected to one first data transmission line 711 through the first data connection portion 211. Exemplarily, one first data line 121 may correspond to one first data connection portion 211 and one first data transmission line 711. Besides, the first data lines 121 may be electrically connected to the corresponding first data transmission lines 711 through the corresponding first data connection portions 211, so that the first data lines 121 corresponding to the same column of sub-pixels spx and divided by the notch region A2 may be electrically connected to the first data transmission lines 711 through the corresponding first data connection portions 211.

During specific implementation, in the embodiments of the present disclosure, as shown in FIG. 6 to FIG. 8A, the second conductive layer 200 may further include: a plurality of second data transmission lines 712 disposed spaced from the first data connection portions 211. The interlayer insulating layer 640 may further include: a plurality of second data via holes 642. One second data line 122 is electrically connected to one second data transmission line 712 through the second data via hole 642. Exemplarily, one second data line 122 may correspond to one second data transmission line 712, and one second data transmission line 712 may correspond to at least one second data via hole 642, so that the second data line 122 may be electrically connected to the corresponding second data transmission line 712 through the corresponding second data via hole 642. In practical applications, one second data transmission line 712 may correspond to one or two or three or more second data via holes 642. These may be designed and determined according to the requirements of practical applications, which is not limited here.

Figure 7A:
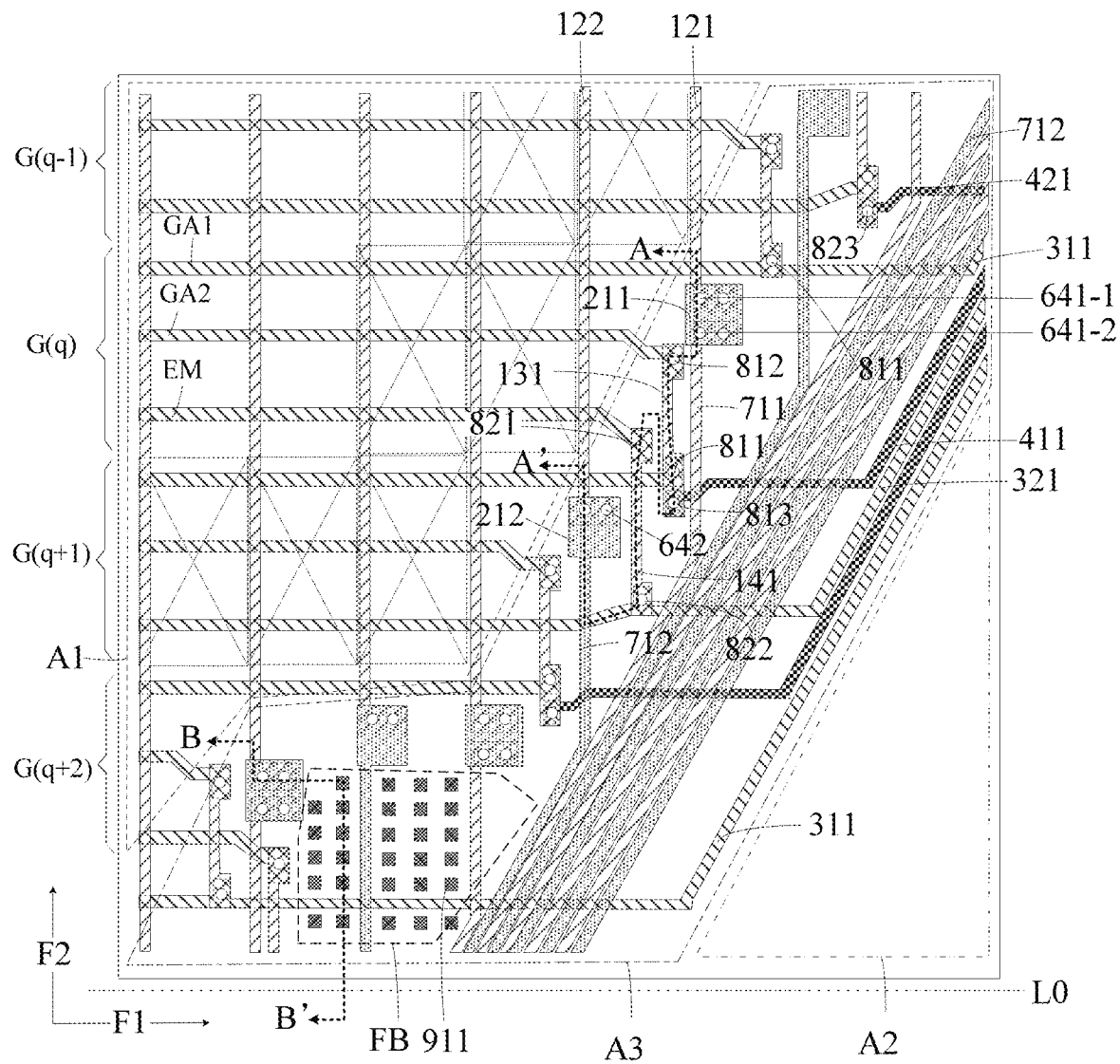
FIG. 7A is a schematic diagram of a layout structure of a local region of some display panels provided by an embodiment of the present disclosure.
Figure 7B:
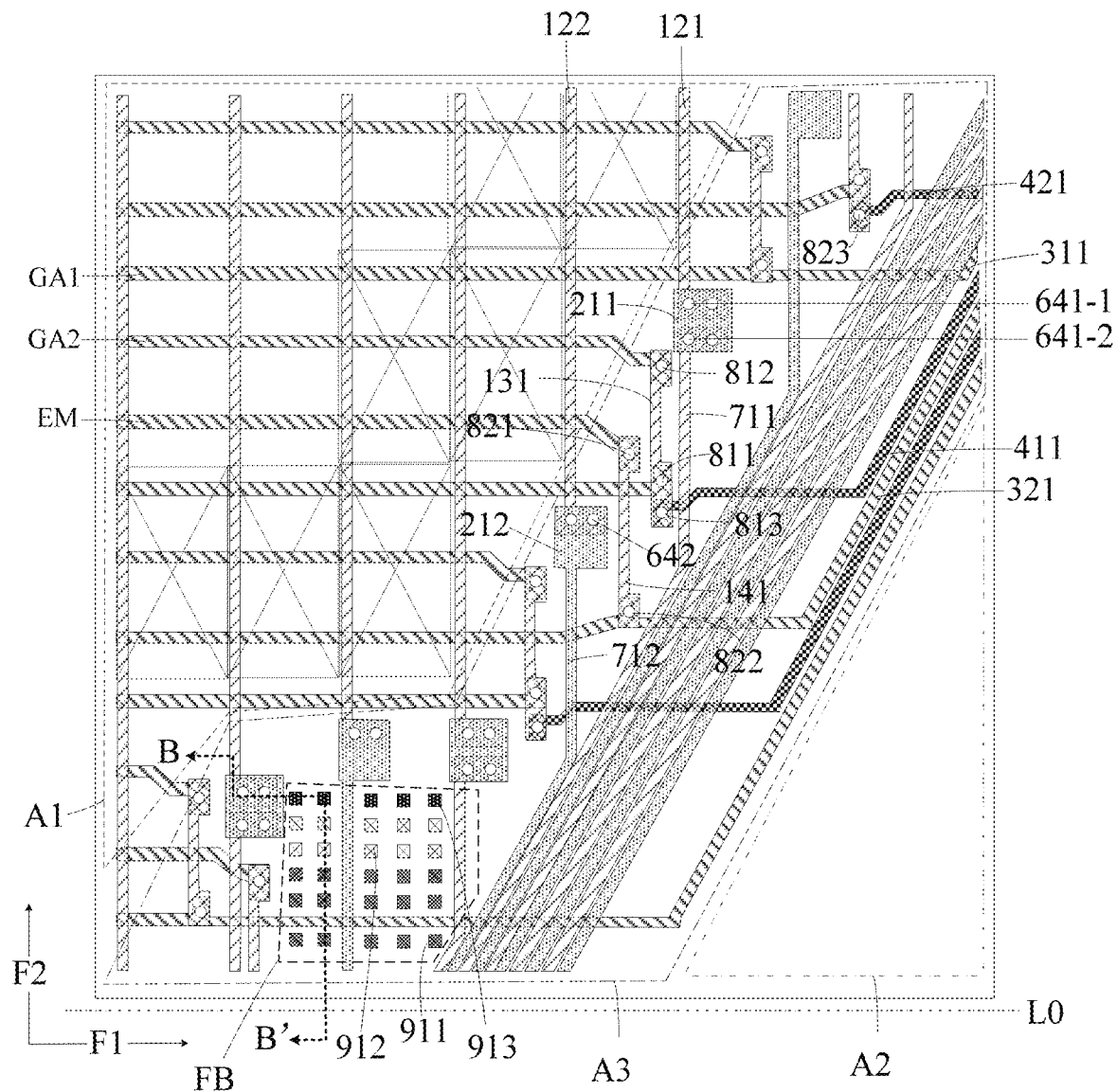
FIG. 7B is a schematic diagram of a layout structure of a local region of further some display panels provided by an embodiment of the present disclosure.

During specific implementation, in the embodiments of the present disclosure, as shown in FIG. 6 to FIG. 7B, the plurality of second data transmission lines 712 are located in the first non-display region A3. Exemplarily, the plurality of second data transmission lines 712 may be disposed in an arc surrounding the notch region A2. Further, orthographic projections of the second data transmission lines 712 on the base substrate 010 and orthographic projections of the first data transmission lines 711 on the base substrate 010 may be disposed in a spaced mode. Exemplarily, as shown in FIG. 6 to FIG. 7B, the orthographic projections of the first data transmission lines 711 on the base substrate 010 and the orthographic projections of the second data transmission lines 712 on the base substrate 010 may be disposed alternately. Since the first data transmission lines 711 and the second data transmission lines 712 are located on different planes, distances between the first data transmission lines 711 and the second data transmission lines 712 may be increased, thereby further lowering signal interference between the first data transmission lines 711 and the second data transmission lines 712.

Exemplarily, in order to reduce the occupation area, an orthographic projection of one second data transmission line 712 on the base substrate 010 and an orthographic projection of one first data transmission line 711 on the base substrate 010 may have an overlapping area. Further, the orthographic projection of one second data transmission line 712 on the base substrate 010 and the orthographic projection of one first data transmission line 711 on the base substrate 010 may be partially overlapped, so that the occupation area of the first data transmission line 711 and the second data transmission line 712 may be reduced to the maximum extent, thereby reducing the occupation area of the first non-display region A3.

During specific implementation, in the embodiments of the present disclosure, as shown in FIG. 6 to FIG. 7B, the plurality of scanning lines may include a plurality of first scanning lines GA1 and a plurality of second scanning lines GA2 located in the display region A1, that is, the third conductive layer 300 may include the plurality of first scanning lines GA1 and the plurality of second scanning lines GA2 located in the display region A1. One row of sub-pixels spx corresponds to one first scanning line GA1 and one second scanning line GA2. Besides, a second scanning line GA2 corresponding to the $(q-1)^{th}$ row of sub-pixels G(q-1) in every two adjacent rows of sub-pixels spx is electrically connected to a first scanning line GA1 corresponding to the $q^{th}$ row of sub-pixels G(q). For example, FIG. 7A and FIG. 7B show four rows of sub-pixels spx arranged in the second direction F2, and in a direction opposite to an arrow of the second direction F2, there may be the $(q-1)^{th}$ row of sub-pixels G(q-1), the $q^{th}$ row of sub-pixels G(q), the $(q+1)^{th}$ row of sub-pixels G(q+1) and the $(q+2)^{th}$ row of sub-pixels G(q+2). The second scanning line GA2 corresponding to the $(q-1)^{th}$ row of sub-pixels G(q-1) is electrically connected to the first scanning line GA1 corresponding to the $q^{th}$ row of sub-pixels G(q), and the second scanning line GA2 corresponding to the $q^{th}$ row of sub-pixels G(q) is electrically connected to the first scanning line GA1 corresponding to the $(q+1)^{th}$ row of sub-pixels G(q+1). The remaining is in the same way and so on, which is not repeated here. It needs to be noted that q is an integer, and FIG. 7A and FIG. 7B only show a part of rows of sub-pixels spx in the display panel.

During specific implementation, in the embodiments of the present disclosure, as shown in FIG. 6 to FIG. 8A, the first conductive layer 100 may further include: a plurality of first scanning connection portions 131 insulated from the data lines and the first data transmission lines 711 and disposed at intervals. The second scanning line GA2 corresponding to the $(q-1)^{th}$ row of sub-pixels G(q-1) is electrically connected to the first scanning line GA1 corresponding to the $q^{th}$ row of sub-pixels G(q) through at least one first scanning connection portion 131. The second insulating layer may further include a plurality of first scanning via holes 811 and a plurality of second scanning via holes 812. First ends of the first scanning connection portions 131 are electrically connected to the corresponding first scanning lines GA1 through at least one of the plurality of first scanning via holes 811, and second ends of the first scanning connection portions 131 are electrically connected to the corresponding second scanning lines GA2 through at least one of the plurality of second scanning via holes 812. Exemplarily, the first scanning lines GA1 and the second scanning lines GA2 electrically connected with each other may correspond to one first scanning connection portion 131. One first scanning connection portion 131 may correspond to at least one first scanning via hole 811 and at least one second scanning via hole 812. For example, one first scanning connection portion 131 may correspond to one first scanning via hole 811 and one second scanning via hole 812. The second scanning line GA2 corresponding to the $(q-1)^{th}$ row of sub-pixels G(q-1) is electrically connected to the first scanning line GA1 corresponding to the $q^{th}$ row of sub-pixels G(q), the second scanning line GA2 and the first scanning line GA1 electrically connected with each other correspond to one first scanning connection portion 131, a first end of the first scanning connection portion 131 is electrically connected to a corresponding first scanning line GA1 through a corresponding first scanning via hole 811, and a second end of the first scanning connection portion 131 is electrically connected to a corresponding second scanning line GA2 through the corresponding second scanning via hole 812. The second scanning line GA2 corresponding to the $q^{th}$ row of sub-pixels G(q) is electrically connected to the first scanning line GA1 corresponding to the $(q+1)^{th}$ row of sub-pixels G(q+1), the second scanning line GA2 and the first scanning line GA1 electrically connected with each other correspond to one first scanning connection portion 131, the first end of the first scanning connection portion 131 is electrically connected to the corresponding first scanning line GA1 through the corresponding first scanning via hole 811, and the second end of the first scanning connection portion 131 is electrically connected to the corresponding second scanning line GA2 through the corresponding second scanning via hole 812. The remaining is in the same way and so on, which is not repeated here. It needs to be noted that the second insulating layer may include: the second gate insulating layer 620 and the interlayer dielectric layer 630.

During specific implementation, in the embodiments of the present disclosure, as shown in FIG. 6 to FIG. 8A, all the rows of sub-pixels spx may include rows of first-type sub-pixels spx. At least one row of sub-pixels spx in the rows of first-type sub-pixels spx corresponds to at least one first data connection portion 211. Exemplarily, the rows of first-type sub-pixels spx may include a part of rows in all the rows of sub-pixels spx. Besides, each row of sub-pixels spx in the rows of first-type sub-pixels spx corresponds to at least one first data connection portion 211. For example, each row in the part of rows of sub-pixels spx in the rows of first-type sub-pixels spx may correspond to one first data connection portion 211, and each row in the remaining rows of sub-pixels spx may correspond to two first data connection portions. Exemplarily, the rows of first-type sub-pixels spx may include the qth row of sub-pixels G(q) shown in FIG. 7A and FIG. 7B.

During specific implementation, in the embodiments of the present disclosure, as shown in FIG. 6 to FIG. 8A, for a first scanning line GA1, a second scanning line GA2 and a first data connection portion 211 corresponding to a same row of sub-pixels spx, an orthographic projection of the first data connection portion 211 on the base substrate 010 is not overlapped with orthographic projections of a first scanning connection portion 131 corresponding to the first scanning line GA1 and a first scanning connection portion 131 corresponding to the second scanning line GA2 on the base substrate 010. In this way, the first data connection portions 211 and the first scanning connection portions 131 may be disposed in a spaced mode to lower the short circuit risk.

During specific implementation, in the embodiments of the present disclosure, as shown in FIG. 6 to FIG. 8A, for a first scanning line GA1, a second scanning line GA2 and a first data connection portion 211 corresponding to a same row of sub-pixels spx, an orthographic projection of the first data connection portion 211 on the base substrate 010 is located between orthographic projections of a first scanning via hole 811 corresponding to the first scanning line GA1 and a second scanning via hole 812 corresponding to the second scanning line GA2 on the base substrate 010. Exemplarily, for the first scanning line GA1, the second scanning line GA2 and the first data connection portion 211 corresponding to the same row of sub-pixels spx, a connection line between a center of the orthographic projection of the first scanning via hole 811 corresponding to the first scanning line GA1 on the base substrate 010 and a center of the orthographic projection of the second scanning via hole 812 corresponding to the second scanning line GA2 on the base substrate is overlapped with the orthographic projection of the first data connection portion 211 on the base substrate 010.

It needs to be noted that the centers of the orthographic projections above may be geometric centers of the orthographic projections. However, in an actual manufacturing process, shapes of the formed structures may generally have a certain deviation from the designed regular shapes. In addition, the shapes of the actually manufactured structures may also have other change with the designed shapes. Therefore, in the embodiments of the present disclosure, the centers of the orthographic projections above may have a certain offset from the geometric centers of the orthographic projections.

During specific implementation, in the embodiments of the present disclosure, as shown in FIG. 6 to FIG. 8A, the second conductive layer 200 may further include: a plurality of second data connection portions 212. One second data transmission line 712 is directly electrically connected to at least one second data connection portion 212, and the second data connection portion 212 is electrically connected to one second data line 122 through the second data via hole 642. Exemplarily, one second data line 122 corresponds to one second data transmission line 712 and one second data connection portion 212, and one second data connection portion 212 corresponds to at least one second data via hole 642. Besides, the second data connection portion 212 is directly electrically connected to the corresponding second data transmission line 712, and the second data connection portion 212 is electrically connected to the corresponding second data line 122 through the corresponding second data via hole 642. Exemplarily, in practical applications, one second data connection portion 212 may correspond to one or two or three or more second data via holes 642. These may be designed and determined according to the requirements of practical applications, which is not limited here.

During specific implementation, in the embodiments of the present disclosure, as shown in FIG. 7A and FIG. 7B, projections of the first data connection portions 211 and the second data connection portions 212 on a straight line extending in the first direction F1 may be arranged alternately. Since the first data lines 121 and the second data lines 122 are arranged alternately in the first direction F1, by alternately arranging the projections of the first data connection portions 211 and the second data connection portions 212 on the straight line extending in the first direction F1, the first data connection portions 211 electrically connected with the first data lines 121 may be disposed corresponding to the second data connection portions 212 electrically connected with the second data lines 122, so that signal interference may be lowered.

During specific implementation, in the embodiments of the present disclosure, as shown in FIG. 6 to FIG. 8A, the orthographic projections of the first data connection portions 211 and the second data connection portions 212 on the base substrate 010 may be not overlapped with the orthographic projections of the first scanning connection portions 131, the first scanning lines GA1, the second scanning lines GA2 and the light emitting control lines EM on the base substrate 010.

During specific implementation, in the embodiments of the present disclosure, as shown in FIG. 7A and FIG. 7B, the light emitting control lines corresponding to two adjacent rows of sub-pixels spx may be electrically connected. Exemplarily, the light emitting control lines corresponding to the $(q-1)^{th}$ row of sub-pixels $G(q-1)$ and the $(q-2)^{th}$ row of sub-pixels are electrically connected, the light emitting control lines corresponding to the $q^{th}$ row of sub-pixels $G(q)$ and the $(q+1)^{th}$ row of sub-pixels $G(q+1)$ are electrically connected, and the light emitting control lines corresponding to the $(q+2)^{th}$ row of sub-pixels $G(q+2)$ and the $(q+3)^{th}$ row of sub-pixels are electrically connected. The remaining is in the same way and so on, which is not repeated here.

Figure 8A:
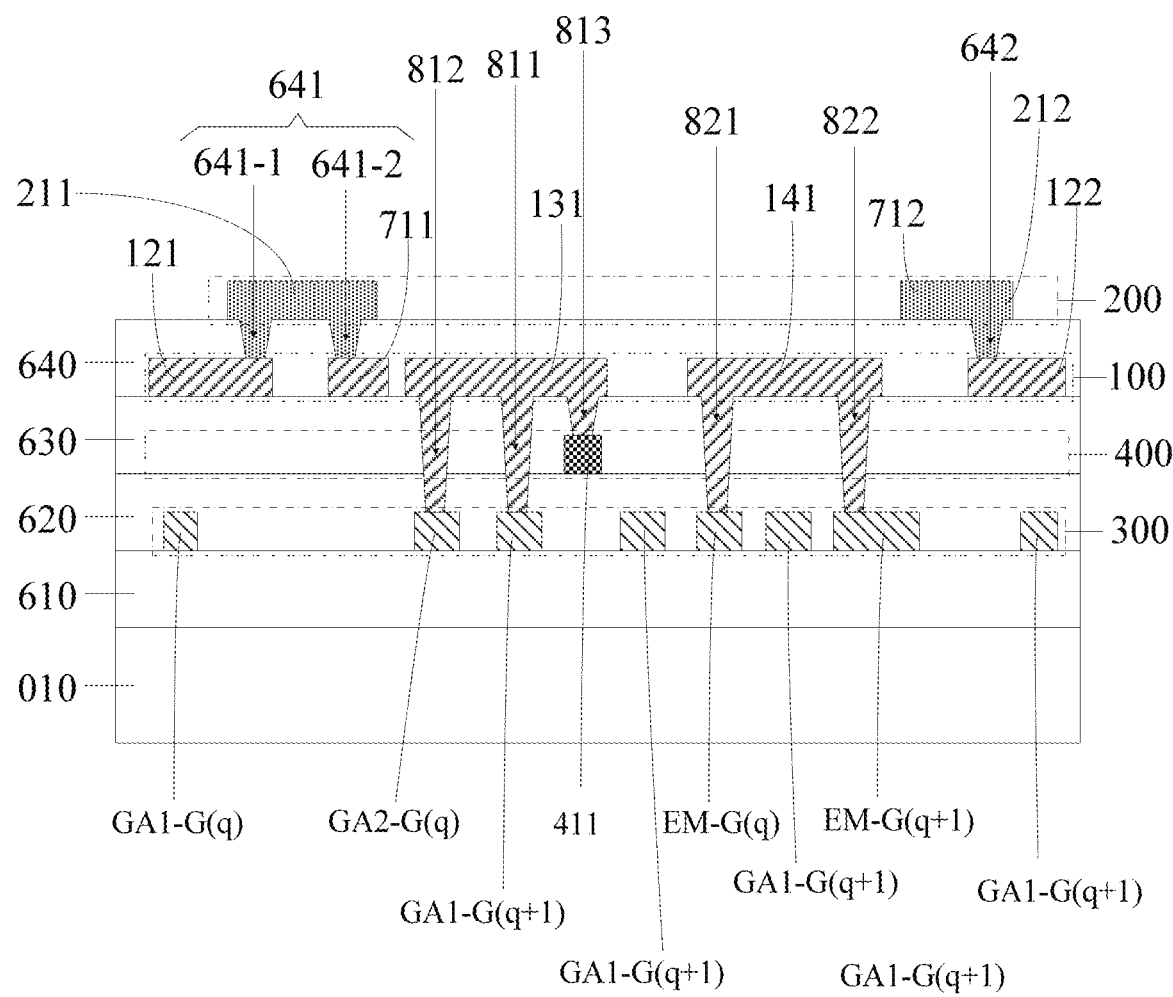
FIG. 8A is a schematic cross-sectional diagram in a direction AA' in the schematic diagram of the layout structure of the local region of the display panels shown in FIG. 7A.

During specific implementation, in the embodiments of the present disclosure, as shown in FIG. 7A, FIG. 7B and FIG. 8A, the first conductive layer 100 may further include: a plurality of first light emitting connection portions 141 insulated from the data lines and the first data transmission lines 711 and disposed at intervals. The light emitting control lines electrically connected with each other correspond to at least one first light emitting connection portion 141. The second insulating layer may include a plurality of first light emitting via holes 821 and a plurality of second light emitting via holes 822. First ends of the first light emitting connection portions 141 are electrically connected to the corresponding light emitting control line through at least one of the plurality of first light emitting via holes 821, and second ends of the first light emitting connection portions 141 are electrically connected to the other corresponding light emitting control line through at least one of the plurality of second light emitting via holes 822. Exemplarily, the light emitting control lines electrically connected with each other may correspond to one first light emitting connection portion 141, and one first light emitting connection portion 141 corresponds to at least one first light emitting via hole 821 and at least one second light emitting via hole 822. Besides, the first ends of the first light emitting connection portions 141 are electrically connected to the corresponding light emitting control line through the corresponding first light emitting via holes 821, and the second ends of the first light emitting connection portions 141 are electrically connected to the other corresponding light emitting control line through the corresponding second light emitting via holes 822. For example, the first ends of the first light emitting connection portions 141 are electrically connected to the light emitting control line corresponding to the $q^{th}$ row of sub-pixels $G(q)$ through the corresponding first light emitting via holes 821, and the second ends of the first light emitting connection portions 141 are electrically connected to the light emitting control line corresponding to the $(q+1)^{th}$ row of sub-pixels $G(q+1)$ through the corresponding second light emitting via holes 822. Exemplarily, one first light emitting connection portion 141 may correspond to one or two or three or more first light emitting via holes 821. One first light emitting connection portion 141 may correspond to one or two or three or more second light emitting via holes 822. These may be designed and determined according to the requirements of practical applications, which is not limited here.

During specific implementation, in the embodiments of the present disclosure, as shown in FIG. 7A to FIG. 8A, the third conductive layer 300 may further include a plurality of first scanning transmission lines 311 and a plurality of first light emitting transmission lines 321 located in the first non-display region A3. The first scanning transmission lines 311 and the first light emitting transmission lines 321 are disposed at intervals. Exemplarily, orthographic projections of the first scanning transmission lines 311 on the base substrate 010 and orthographic projections of the first light emitting transmission lines 321 on the base substrate 010 may be disposed in a spaced mode. Further, the orthographic projections of the first scanning transmission lines 311 on the base substrate 010 and the orthographic projections of the first light emitting transmission lines 321 on the base substrate 010 may be disposed alternately. Further, the first scanning transmission lines 311 and the first light emitting transmission lines 321 may be disposed in an arc surrounding the first non-display region A3. Of course, these may be designed and determined according to the requirements of practical applications, which is not limited here.

During specific implementation, in the embodiments of the present disclosure, as shown in FIG. 7A to FIG. 8A, a part of the first scanning lines GA1 and the second scanning lines GA2 electrically connected with each other are directly electrically connected to one first scanning transmission line 311 correspondingly; and a part of the light emitting control lines electrically connected with each other are directly electrically connected with one first light emitting transmission line 321. In this way, the first scanning lines GA1 in the third conductive layer 300 may be directly electrically connected to the first scanning transmission lines 311, and the light emitting control lines may be directly electrically connected to the first light emitting transmission lines 321, so that the design difficulty of these signal lines may be lowered.

During specific implementation, in the embodiments of the present disclosure, as shown in FIG. 7A to FIG. 8A, the fourth conductive layer 400 may further include a plurality of second scanning transmission lines 411 and a plurality of second light emitting transmission lines 421 located in the first non-display region A3. The second scanning transmission lines 411 and the second light emitting transmission lines 421 are disposed at intervals. Exemplarily, orthographic projections of the second scanning transmission lines 411 on the base substrate 010 and orthographic projections of the second light emitting transmission lines 421 on the base substrate 010 may be disposed in a spaced mode. Further, the orthographic projections of the second scanning transmission lines 411 on the base substrate 010 and the orthographic projections of the second light emitting transmission lines 421 on the base substrate 010 may be disposed alternately. Further, the second scanning transmission lines 411 and the second light emitting transmission lines 421 may be disposed in an arc surrounding the first non-display region A3. Of course, these may be designed and determined according to the requirements of practical applications, which is not limited here.

During specific implementation, in the embodiments of the present disclosure, as shown in FIG. 7A to FIG. 8A, the interlayer dielectric layer 630 may further include a plurality of third scanning via holes 813 and a plurality of third light emitting via holes 823. In addition to the part of the first scanning lines GA1 and the second scanning lines GA2 electrically connected with each other, the remaining part of the first scanning lines GA1 and the second scanning lines GA2 electrically connected with each other correspond to one second scanning transmission line 411, and the first scanning connection portion 131 corresponding to the remaining part of the first scanning lines GA1 electrically connected with each other is further electrically connected with the second scanning transmission line 411 by means of the third scanning via holes 813. In this way, the first scanning lines GA1 corresponding to the same row of sub-pixels spx and divided by the notch region A2 may be electrically connected by means of the second scanning transmission line 411. Exemplarily, one second scanning transmission line 411 may correspond to one or two or three or more third scanning via holes 813. These may be designed and determined according to the requirements of practical applications, which is not limited here.

During specific implementation, in the embodiments of the present disclosure, as shown in FIG. 7A to FIG. 8A, in addition to the part of light emitting control lines electrically connected with each other, the remaining part of the light emitting control lines electrically connected with each other correspond to one second light emitting transmission line 421, and the first light emitting connection portions 141 are further electrically connected to the second light emitting transmission line 421 through the third light emitting via holes 823. In this way, the light emitting control lines corresponding to the same row of sub-pixels spx and divided by the notch region A2 may be electrically connected by means of the second light emitting transmission line 421.

Exemplarily, one second light emitting transmission line 421 may correspond to one or two or three or more third light emitting via holes 823. These may be designed and determined according to the requirements of practical applications, which is not limited here.

Besides, the first scanning transmission lines 311, the second scanning transmission lines 411, the first light emitting transmission lines 321 and the second light emitting transmission lines 421 are all disposed in the first non-display region A3. The first scanning transmission lines 311 and the first light emitting transmission lines 321 are disposed in the third conductive layer 300, and the second scanning transmission lines 411 and the second light emitting transmission lines 421 are disposed in the fourth conductive layer 400, so that signal interference between the first scanning transmission lines 311, the second scanning transmission lines 411, the first light emitting transmission lines 321 and the second light emitting transmission lines 421 may be lowered.

Exemplarily, the orthographic projections of the first scanning transmission lines 311 on the base substrate 010 and the orthographic projections of a part of the first data transmission lines 711 on the base substrate 010 may have an overlapping area. Further, the orthographic projection of one first scanning transmission line 311 on the base substrate 010 and the orthographic projection of one first data transmission line 711 on the base substrate 010 may be partially overlapped. Exemplarily, the orthographic projections of the first light emitting transmission lines 321 on the base substrate 010 and the orthographic projections of the remaining part of the first data transmission lines 711 on the base substrate 010 may have an overlapping area. Further, the orthographic projection of one first light emitting transmission line 321 on the base substrate 010 and the orthographic projection of one of the remaining part of the first data transmission lines 711 on the base substrate 010 may be partially overlapped. In this way, the occupation area of the first non-display region may be reduced.

Exemplarily, the orthographic projections of the second scanning transmission lines 411 on the base substrate 010 and the orthographic projections of a part of the second data transmission lines 712 on the base substrate 010 may have an overlapping area. Further, the orthographic projection of one second scanning transmission line 411 on the base substrate 010 and the orthographic projection of one second data transmission line 712 on the base substrate 010 may be partially overlapped. Exemplarily, the orthographic projections of the second light emitting transmission lines 421 on the base substrate 010 and the orthographic projections of the remaining part of the second data transmission lines 712 on the base substrate 010 may have an overlapping area. Further, the orthographic projection of one second light emitting transmission line 421 on the base substrate 010 and the orthographic projection of one of the remaining part of the second data transmission lines 712 on the base substrate 010 may be partially overlapped. In this way, the occupation area of the first non-display region may be reduced.

During specific implementation, in the embodiments of the present disclosure, as shown in FIG. 7A to FIG. 8A, all the rows of sub-pixels spx may also include rows of second-type sub-pixels spx. The rows of second-type sub-pixels spx are different from the rows of first-type sub-pixels spx. Besides, at least one row of sub-pixels spx in the rows of second-type sub-pixels spx corresponds to at least one second data connection portion 212. Exemplarily, each row of sub-pixels spx in the rows of second-type sub-pixels spx corresponds to at least one second data connection portion 212. Exemplarily, each row of sub-pixels spx in the rows of second-type sub-pixels spx corresponds to at least one second data connection portion 212. It needs to be noted that the rows of second-type sub-pixels spx may be a part of rows in the display panel, and their specific positions can be designed and determined according to requirements of the practical application environment, which is not limited here. Exemplarily, the rows of second-type sub-pixels spx may include the first row of sub-pixels and the third row of sub-pixels shown in FIG. 7B.

During specific implementation, in the embodiments of the present disclosure, as shown in FIG. 7A to FIG. 8A, for a first scanning line GA1, a second scanning line GA2 and a second data connection portion 212 corresponding to a same row of sub-pixels spx, an orthographic projection of the second data connection portion 212 on the base substrate 010 is not overlapped with orthographic projections of a first scanning connection portion 131 corresponding to the first scanning line GA1 and a first scanning connection portion 131 corresponding to the second scanning line GA2 on the base substrate 010. In this way, the second data connection portions 212 and the first scanning connection portions 131 may be disposed in a spaced mode to lower the short circuit risk.

During specific implementation, in the embodiments of the present disclosure, as shown in FIG. 7A to FIG. 8A, for a first scanning line GA1, a second scanning line GA2 and a second data connection portion 212 corresponding to a same row of sub-pixels spx, an orthographic projection of the second data connection portion 212 on the base substrate 010 is located between orthographic projections of a first scanning via hole 811 corresponding to the first scanning line GA1 and a second scanning via hole 812 corresponding to the second scanning line GA2 on the base substrate 010. Exemplarily, for the first scanning line GA1, the second scanning line GA2 and the second data connection portion 212 corresponding to the same row of sub-pixels spx, a connection line between a center of the orthographic projection of the second scanning via hole 812 corresponding to the first scanning line GA1 on the base substrate 010 and a center of the orthographic projection of the second scanning via hole 812 corresponding to the second scanning line GA2 on the base substrate is overlapped with the orthographic projection of the second data connection portion 212 on the base substrate 010.

During specific implementation, in the embodiments of the present disclosure, as shown in FIG. 7A to FIG. 8A, an orthographic projection of a second data connection portion 212 on the base substrate 010 is not overlapped with an orthographic projection of the first light emitting connection portions 141 on the base substrate 010, an orthographic projection of the first scanning connection portion 131 on the base substrate 010, an orthographic projection of a first scanning line GA1 on the base substrate 010 and an orthographic projection of a second scanning line GA2 on the base substrate 010.

During specific implementation, in the embodiments of the present disclosure, as shown in FIG. 7A to FIG. 8A, for a light emitting control line EM, a second scanning line GA2 and a second data connection portion 212 corresponding to a same row of sub-pixels spx, an orthographic projection of the second data connection portion 212 on the base substrate 010 is located between orthographic projections of a second scanning via hole 812 corresponding to the second scanning line GA2 and a first light emitting via hole 821 corresponding to a light emitting control line on the base substrate 010.

In practical applications, the transistors in the sub-pixels spx generally need to be electrically connected, and electric connection of these transistors is related to characteristics of the transistors, so that the characteristics of the transistors may be uniform if the electric connection of the transistors is uniform. Generally, a wet etching method is adopted, and the electrically connected via holes are prepared through an etching liquid. However, when the via holes of the sub-pixels spx at the edge of the display region A1 are etched, no via hole needs to be etched outside the edge of the display region A1, and thus the etching degree of the via holes of the sub-pixels spx at the edge of the display region A1 is different from the etching degree of the via holes of the sub-pixels spx in the display region A1, leading to non-uniformity of the characteristics of the transistors in the sub-pixels spx at the edge of the display region A1 and the transistors in the interior sub-pixels spx. In order to improve the uniformity of the characteristics of the transistors, during specific implementation, in the embodiments of the present disclosure, the display panel, a target insulating layer located between a first conductive layer and a base substrate, a function layer located between the target insulating layer and the base substrate, and at least one of the plurality of sub-pixels may include: one or more connection via holes. The connection via holes penetrate through the target insulating layer, and the first conductive layer is electrically connected with the function layer by means of the connection via holes. The first non-display region includes at least one auxiliary via hole. The auxiliary via hole penetrates through the target insulating layer and is not filled with a conductive material. Besides, in the first non-display region, at least two of the plurality of data transmission lines, the plurality of scanning transmission lines and the plurality of light emitting transmission lines form an auxiliary region in a surrounding mode, and the auxiliary via hole is located in the auxiliary region. Further, exemplarily, a distance between two adjacent auxiliary via holes may also be smaller than or substantially equal to a distance between two adjacent connection via holes.

In practical applications, first connection via holes are configured to achieve electric connection of the transistors in the sub-pixels spx, and the electric connection of these transistors is related to the characteristics of the transistors, so that the characteristics of the transistors may be uniform if the electric connection of the transistors is uniform. Generally, a wet etching method is adopted, and the first connection via holes are prepared through an etching liquid. However, when the first connection via holes of the sub-pixels spx at the edge of the display region A1 are etched, no first connection via hole needs to be etched outside the edge of the display region A1, and thus the etching degree of the first connection via holes of the sub-pixels spx at the edge of the display region A1 is different from the etching degree of the first connection via holes of the sub-pixels spx in the display region A1, leading to non-uniformity of the characteristics of the transistors in the sub-pixels spx at the edge of the display region A1 and the transistors in the interior sub-pixels spx. In order to improve the uniformity of the characteristics of the transistors, during specific implementation, in the embodiments of the present disclosure, the function layers may include semiconductor layers. The target insulating layers may include: a first gate insulating layer, a second gate insulating layer and a interlayer dielectric layer. The connection via holes may include the first connection via holes. The auxiliary via holes may include first auxiliary via holes, and the first auxiliary via holes penetrate through the first gate insulating layer, the second gate insulating layer and the interlayer dielectric layer. Exemplarily, as shown in FIG. 7A to FIG. 8C, the display panel may further include at least one first auxiliary via hole 911 located in the first non-display region A3. The first auxiliary via hole 911 penetrates through the first gate insulating layer 610, the second gate insulating layer 620 and the interlayer dielectric layer 630, and the first auxiliary via hole 911 is not filled with a conductive material. Besides, in the first non-display region A3, at least two of the plurality of data transmission lines, the plurality of scanning transmission lines and the plurality of light emitting transmission lines may form an auxiliary region FB in a surrounding mode, and the first auxiliary via hole 911 may be located in the auxiliary region FB. In this way, the first auxiliary via hole 911 may be disposed outside the edge of the display region A1, namely in the first non-display region A3, and the first auxiliary via hole 911 and the first connection via holes penetrate through the same insulating layer. Therefore, the first auxiliary via hole 911 is also etched in the first non-display region A3, the first connection via holes etched in the sub-pixels spx at the edge of the display region and the first connection via holes etched in the interior sub-pixels spx are uniform in etching effect, and the uniformity of the characteristics of the transistors is improved.

During specific implementation, the first auxiliary via hole 911 may be filled with an insulating material. For example, the first auxiliary via hole 911 may be filled with a material of the interlayer insulating layer 640. In this way, when the interlayer insulating layer 640 is prepared, the first auxiliary via hole 911 may be directly filled to improve the flatness of the interlayer insulating layer 640.

During specific implementation, which transmission lines are specifically adopted to form the auxiliary region FB in the surrounding mode may be designed and determined according to the requirements of practical applications, which is not limited here.

Figure 8B:
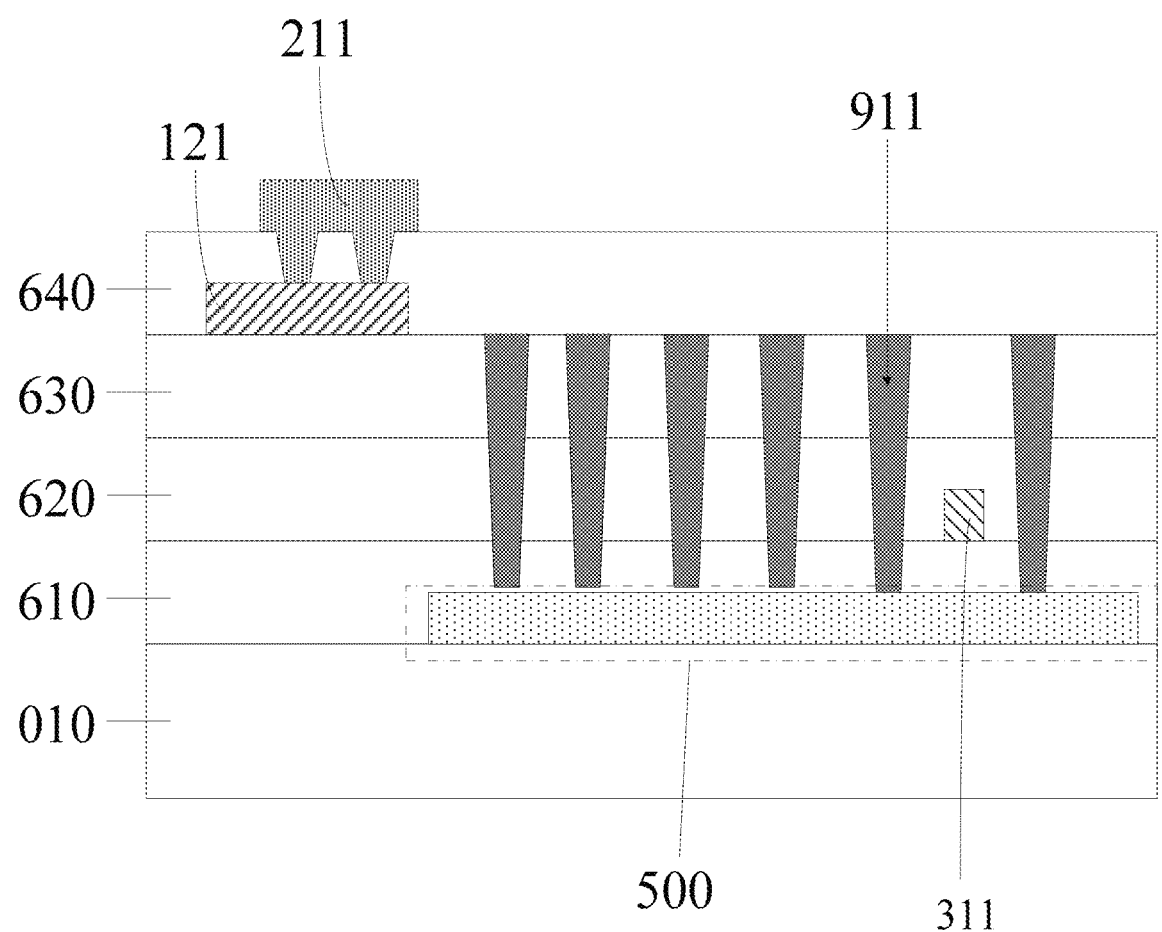
FIG. 8B is a schematic cross-sectional diagram in a direction BB' in the schematic diagram of the layout structure of the local region of the display panels shown in FIG. 7A.
Figure 8C:
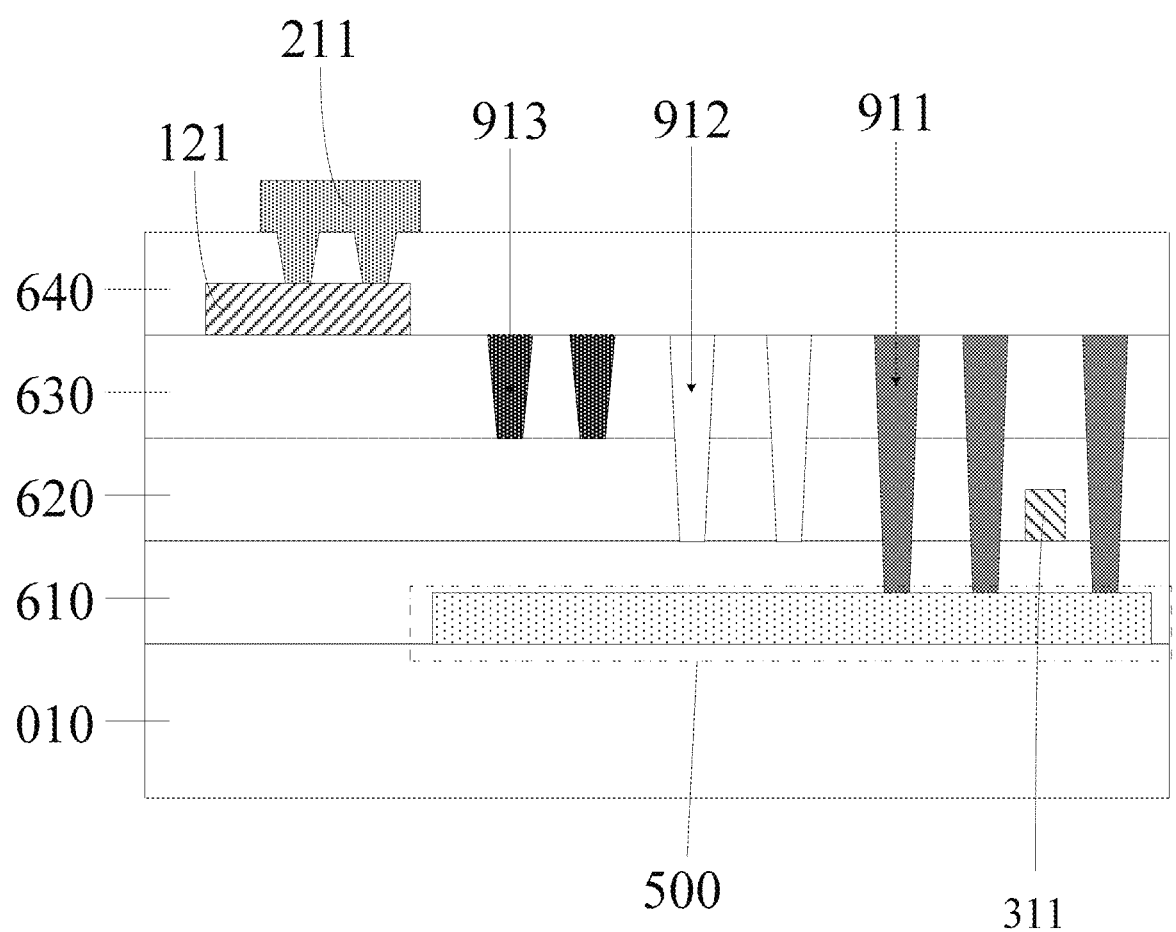
FIG. 8C is a schematic cross-sectional diagram in a direction BB' in the schematic diagram of the layout structure of the local region of the display panels shown in FIG. 7B.
Figure 9A:
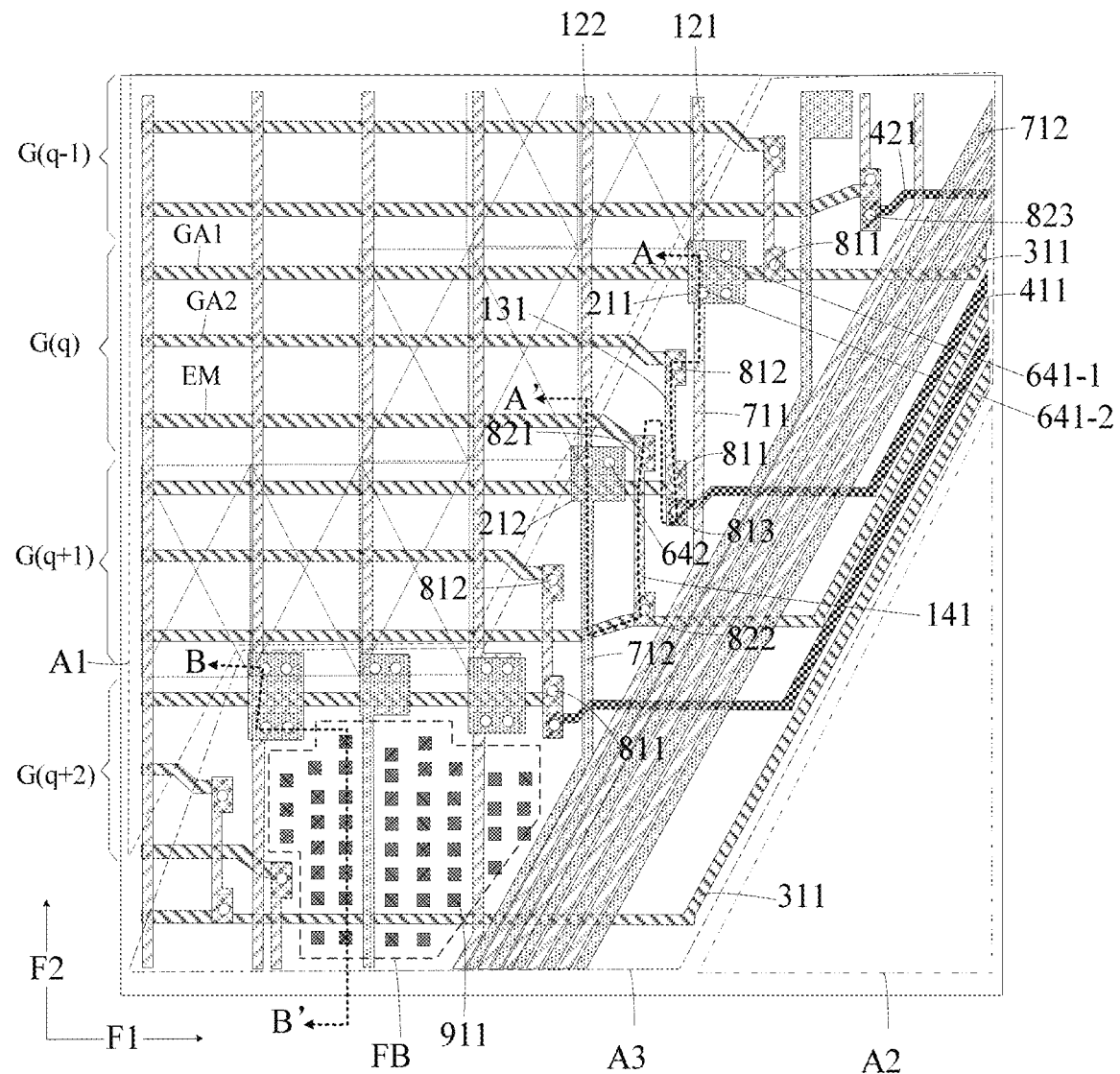
FIG. 9A is a schematic diagram of a layout structure of a local region of further some display panels provided by an embodiment of the present disclosure.
Figure 9B:
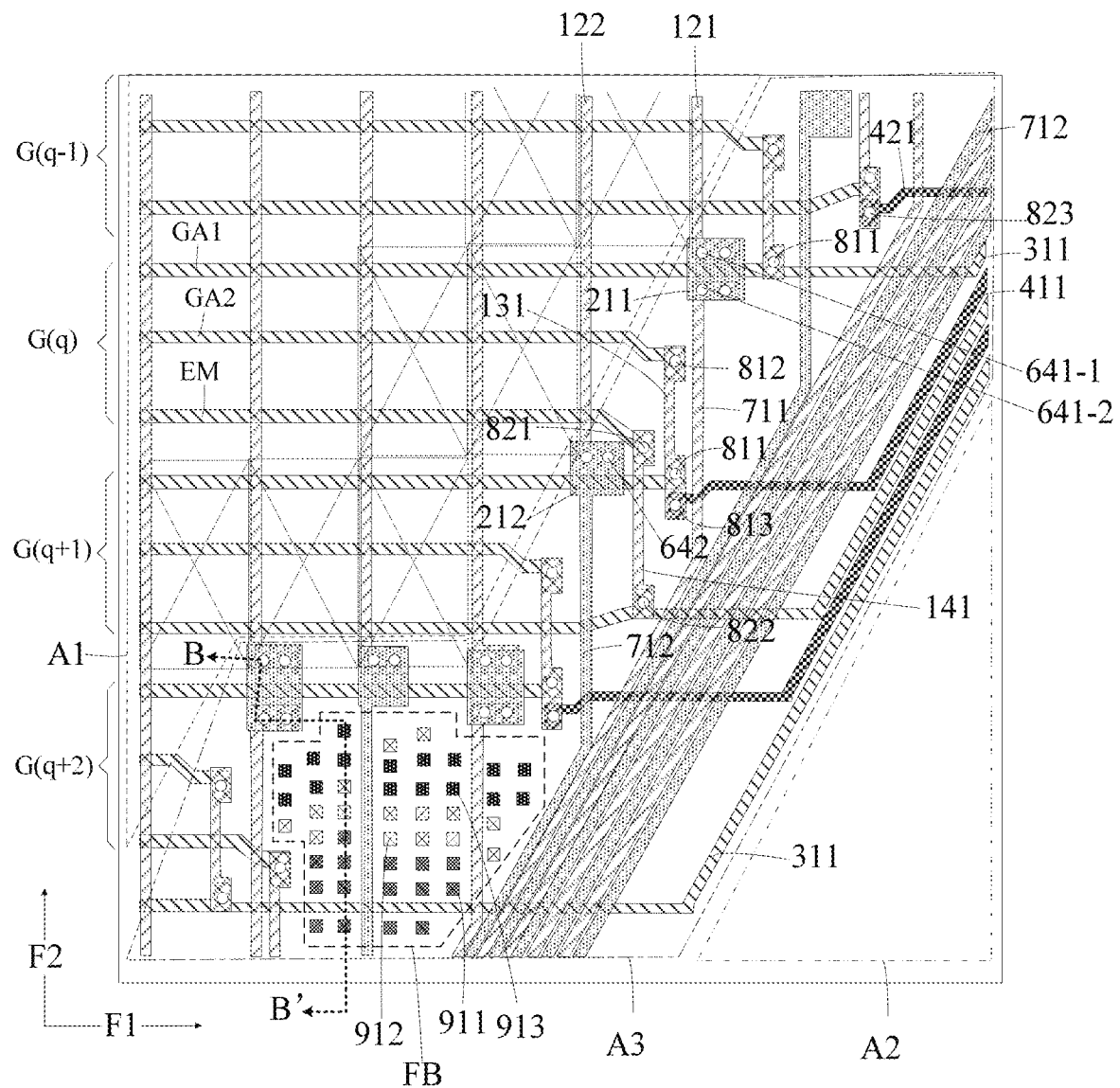
FIG. 9B is a schematic diagram of a layout structure of a local region of further some display panels provided by an embodiment of the present disclosure.

It needs to be noted that, since when the semiconductor layer is patterned, the semiconductor layer in the first non-display region A3 is not etched off, the semiconductor layer is still reserved in the first non-display region A3, as shown in FIG. 8B and FIG. 8C. In this way, a depth of a first auxiliary via hole 911 in a direction perpendicular to a plane where the base substrate is located is substantially the same as a depth of a first connection via hole in the direction perpendicular to the plane where the base substrate is located. In this way, the etching degrees of the etching liquid on the first auxiliary via hole 911 and the first connection via hole are substantially the same, thereby further improving the uniformity of the characteristics of the transistors.

Exemplarily, during specific implementation, in the embodiments of the present disclosure, a plurality of first auxiliary via holes 911 may be disposed in the first non-display region A3. For example, a distribution density of the first auxiliary via holes 911 may be substantially equal to a distribution density of the first connection via holes. In this way, the first connection via holes etched in the sub-pixels spx at the edge of the display region and the first connection via holes etched in the interior sub-pixels spx are uniform in etching effect, and the uniformity of the characteristics of the transistors is improved.

Exemplarily, during specific implementation, in the embodiments of the present disclosure, the distribution density of the first auxiliary via holes 911 may also be smaller than the distribution density of the first connection via holes. Since other traces or connection portions are further disposed in the first non-display region A3, the occupation area of all the first auxiliary via holes 911, which are regarded as a whole, may be reduced by lowering the distribution density of the first auxiliary via holes 911, and the occupation area of the first non-display region A3 is reduced. Besides, the first auxiliary via holes 911 are further disposed, so that the first connection via holes etched in the sub-pixels spx at the edge of the display region and the first connection via holes etched in the interior sub-pixels spx are uniform in etching effect, and the uniformity of the characteristics of the transistors is improved.

It needs to be noted that the distribution density of the first auxiliary via holes 911 may be the quantity of the first auxiliary via holes 911 in the unit area. The distribution density of the first connection via holes may be the quantity of the first connection via holes in the unit area. In practical applications, the distribution densities of the first auxiliary via holes 911 and the first connection via holes may be designed and determined according to the requirements of the practical application environment, which is not limited here.

Exemplarily, during specific implementation, in the embodiments of the present disclosure, the distance between two adjacent first auxiliary via holes may be substantially equal to the distance between two adjacent first connection via holes. In this way, the distance between the first connection via holes may be adopted for design, without additionally designing the distance between the first auxiliary via holes. Of course, the distance between two adjacent first auxiliary via holes may also be smaller than the distance between two adjacent first connection via holes. In this way, the first auxiliary via holes may be disposed in a compact mode to reduce the occupation area of the first non-display region.

Exemplarily, during specific implementation, in the embodiments of the present disclosure, as shown in FIG. 7A to FIG. 8C, an orthographic projection of a first auxiliary via hole 911 on the base substrate 010 is not overlapped with orthographic projections of a semiconductor layer, a first conductive layer 100, a third conductive layer 300 and a fourth conductive layer 400 on the base substrate 010. In this way, the impact on the conductive layer and the semiconductor layer may be lowered when the first auxiliary via hole 911 is etched.

In practical applications, second connection via holes are also configured to achieve electric connection of the transistors in the sub-pixels spx, and the electric connection of these transistors is related to the characteristics of the transistors, so that the characteristics of the transistors may be uniform if the electric connection of the transistors is uniform. Generally, a wet etching method is adopted, and the second connection via holes are prepared through an etching liquid. However, when the second connection via holes of the sub-pixels spx at the edge of the display region A1 are etched in the display region A1, no second connection via hole needs to be etched outside the edge of the display region A1, and thus the etching degree of the second connection via holes of the sub-pixels spx at the edge of the display region A1 is different from the etching degree of the second connection via holes of the sub-pixels spx in the display region A1, leading to non-uniformity of the characteristics of the transistors in the sub-pixels spx at the edge of the display region A1 and the transistors in the interior sub-pixels spx. In order to improve the uniformity of the characteristics of the transistors, during specific implementation, in the embodiments of the present disclosure, the function layers include the third conductive layer. The target insulating layers include: the second gate insulating layer and the interlayer dielectric layer. The connection via holes include the second connection via holes. The auxiliary via holes include second auxiliary via holes, and the second auxiliary via holes penetrate through the second gate insulating layer and the interlayer dielectric layer. Exemplarily, as shown in FIG. 7B and FIG. 8C, the display panel may further include at least one second auxiliary via hole 912 located in the first non-display region A3. The second auxiliary via hole 912 penetrates through the second gate insulating layer 620 and the interlayer dielectric layer 630, and the second auxiliary via hole 912 is not filled with a conductive material. Besides, the second auxiliary via hole 912 may also be located in the auxiliary region FB. During specific implementation, the second auxiliary via hole 912 may be filled with an insulating material. For example, the second auxiliary via hole 912 may be filled with a material of the interlayer insulating layer 640. In this way, when the interlayer insulating layer 640 is prepared, the second auxiliary via hole 912 may be directly filled to improve the flatness of the interlayer insulating layer 640.

Exemplarily, during specific implementation, in the embodiments of the present disclosure, a plurality of second auxiliary via holes 912 may be disposed in the first non-display region A3. For example, a distribution density of the second auxiliary via holes 912 may be substantially equal to a distribution density of the second connection via holes. In this way, the second connection via holes etched in the sub-pixels spx at the edge of the display region and the second connection via holes etched in the interior sub-pixels spx are uniform in etching effect, and the uniformity of the characteristics of the transistors is improved.

Exemplarily, during specific implementation, in the embodiments of the present disclosure, the distribution density of the second auxiliary via holes 912 may also be smaller than the distribution density of the second connection via holes. Since other traces or connection portions are further disposed in the first non-display region A3, the occupation area of all the second auxiliary via holes 912, which are regarded as a whole, may be reduced by lowering the distribution density of the second auxiliary via holes 912, and the occupation area of the first non-display region A3 is reduced. Besides, the second auxiliary via holes 912 are further disposed, so that the second connection via holes etched in the sub-pixels spx at the edge of the display region and the first connection via holes etched in the interior sub-pixels spx are uniform in etching effect, and the uniformity of the characteristics of the transistors is improved.

It needs to be noted that the distribution density of the second auxiliary via holes 912 may be the quantity of the second auxiliary via holes 912 in the unit area. The distribution density of the second connection via holes may be the quantity of the second connection via holes in the unit area. In practical applications, the distribution densities of the second auxiliary via holes 912 and the second connection via holes may be designed and determined according to the requirements of the practical application environment, which is not limited here.

It needs to be noted that, since when the third conductive layer 300 is patterned, the third conductive layer 300 in the first non-display region A3 will be etched off, the third conductive layer 300 will not be reserved in the first non-display region A3, as shown in FIG. 8c. In this way, a depth of the second auxiliary via holes 912 in a direction perpendicular to a plane where the base substrate is located is greater than a depth of the second connection via holes in the direction perpendicular to the plane where the base substrate is located.

Exemplarily, during specific implementation, in the embodiments of the present disclosure, the distance between two adjacent second auxiliary via holes may be substantially equal to the distance between two adjacent second connection via holes. In this way, the distance between the second connection via holes may be adopted for design, without additionally designing the distance between the second auxiliary via holes. Of course, the distance between two adjacent second auxiliary via holes may also be smaller than the distance between two adjacent second connection via holes. In this way, the second auxiliary via holes may be disposed in a compact mode to reduce the occupation area of a second non-display region.

Exemplarily, during specific implementation, in the embodiments of the present disclosure, as shown in FIG. 7B, an orthographic projection of a second auxiliary via hole 912 on the base substrate 010 is not overlapped with orthographic projections of a first conductive layer 100, a third conductive layer 300 and a fourth conductive layer 400 on the base substrate 010. In this way, the impact on the conductive layers and the semiconductor layer may be lowered when the second auxiliary via holes 912 are etched.

In practical applications, third connection via holes are also configured to achieve the electric connection of the transistors in the sub-pixels spx, and the electric connection of these transistors is related to the characteristics of the transistors, so that the characteristics of the transistors may be uniform if the electric connection of the transistors is uniform. Generally, a wet etching method is adopted, and the third connection via holes are prepared through an etching liquid. However, when the third connection via holes of the sub-pixels spx at the edge of the display region A1 are etched, no third connection via hole needs to be etched outside the edge of the display region A1, and thus the etching degree of the third connection via holes of the sub-pixels spx at the edge of the display region A1 is different from that of the third connection via holes of the sub-pixels spx in the display region A1, leading to non-uniformity of the characteristics of the transistors in the sub-pixels spx at the edge of the display region A1 and the transistors in the interior sub-pixels spx. In order to improve the uniformity of the characteristics of the transistors, during specific implementation, in the embodiments of the present disclosure, the function layers include the fourth conductive layer. The target insulating layers include: the interlayer dielectric layer. The connection via holes include the third connection via holes. The auxiliary via holes include third auxiliary via holes, and the third auxiliary via holes penetrate through the interlayer dielectric layer. Exemplarily, as shown in FIG. 7b and FIG. 8c, the display panel may further include at least one third auxiliary via hole 913 located in the first non-display region A3. The third auxiliary via hole 913 penetrates through the interlayer dielectric layer 630, and the third auxiliary via hole 913 is not filled with a conductive material. Besides, the third auxiliary via hole 913 may also be located in the auxiliary region FB. During specific implementation, the third auxiliary via hole 913 may be filled with an insulating material. For example, the third auxiliary via hole 913 may be filled with a material of the interlayer insulating layer 640. In this way, when the interlayer insulating layer 640 is prepared, the third auxiliary via hole 913 may be directly filled to improve the flatness of the interlayer insulating layer 640.

Exemplarily, during specific implementation, in the embodiments of the present disclosure, a plurality of third auxiliary via holes 913 may be disposed in the first non-display region A3. For example, a distribution density of the third auxiliary via holes 913 may be substantially equal to a distribution density of the third connection via holes. In this way, the third connection via holes etched in the sub-pixels spx at the edge of the display region and the third connection via holes etched in the interior sub-pixels spx are uniform in etching effect, and the uniformity of the characteristics of the transistors is improved.

Exemplarily, during specific implementation, in the embodiments of the present disclosure, the distribution density of the third auxiliary via holes 913 may also be smaller than the distribution density of the third connection via holes. Since other traces or connection portions are further disposed in the first non-display region A3, the occupation area of all the third auxiliary via holes 913, which are regarded as a whole, may be reduced by lowering the distribution density of the third auxiliary via holes 913, and the occupation area of the first non-display region A3 is reduced. Besides, the third auxiliary via holes 913 are further disposed, so that the third connection via holes etched in the sub-pixels spx at the edge of the display region and the first connection via holes etched in the interior sub-pixels spx are uniform in etching effect, and the uniformity of the characteristics of the transistors is improved.

It needs to be noted that the distribution density of the third auxiliary via holes 913 may be the quantity of the third auxiliary via holes 913 in the unit area. The distribution density of the third connection via holes may be the quantity of the third connection via holes in the unit area. In practical applications, the distribution densities of the third auxiliary via holes 913 and the third connection via holes may be designed and determined according to the requirements of the practical application environment, which is not limited here.

It needs to be noted that, since when the fourth conductive layer 400 is patterned, the fourth conductive layer 400 in the first non-display region A3 will be etched off, the fourth conductive layer 400 will not be reserved in the first non-display region A3, as shown in FIG. 8*c*. In this way, a depth of the third auxiliary via holes 913 in a direction perpendicular to a plane where the base substrate is located is greater than a depth of the third connection via holes in the direction perpendicular to the plane where the base substrate is located.

Exemplarily, during specific implementation, in the embodiments of the present disclosure, the distance between two adjacent third auxiliary via holes may be substantially equal to the distance between two adjacent third connection via holes. In this way, the distance between the third connection via holes may be adopted for design, without additionally designing the distance between the third auxiliary via holes. Of course, the distance between two adjacent third auxiliary via holes may also be smaller than the distance between two adjacent third connection via holes. In this way, the third auxiliary via holes may be disposed in a compact mode to reduce the occupation area of the first non-display region.

Exemplarily, during specific implementation, in the embodiments of the present disclosure, as shown in FIG. 7B, an orthographic projection of the third auxiliary via holes 913 on the base substrate 010 is not overlapped with the orthographic projections of the first conductive layer 100 and the fourth conductive layer 400 on the base substrate 010. In this way, the impact on the conductive layers and the semiconductor layer may be lowered when the third auxiliary via holes 913 are etched.

It needs to be noted that, as shown in FIG. 8A, GA1-G(q) represents the first scanning line corresponding to the $q^{th}$ row of sub-pixels. GA2-G(q) represents the second scanning line corresponding to the $q^{th}$ row of sub-pixels. GA1-G(q+1) represents the first scanning line corresponding to the $(q+1)^{th}$ row of sub-pixels. EM-G(q) represents the light emitting control line corresponding to the $q^{th}$ row of sub-pixels. EM-G(q+1) represents the light emitting control line corresponding to the $(q+1)^{th}$ row of sub-pixels. The following is the same, which is omitted here.

It needs to be noted that due to the limitation of process conditions or other factors, the same or equal in the above features cannot be exactly the same or equal, and there may be some deviations. Therefore, as long as the same or equal relationship between the above features roughly meets the above conditions, it belongs to the protection scope of the present disclosure. For example, the same above may be the same allowed within an error allowance range.

An embodiment of the present disclosure further provides some other display panels, as shown in FIG. 9A to FIG. 10CA, and transformation is performed for a part of the implementations in the above embodiments. Only the difference between the present embodiment and the above embodiments is explained below, and similarities are omitted here.

During specific implementation, in the embodiments of the present disclosure, as shown in FIG. 9A to FIG. 10A, for a first scanning line GA1 and a first data connection portion 211 corresponding to the same row of sub-pixels spx, and a first data line 121 and a first data transmission line 711 electrically connected by means of the first data connection portion 211, an orthographic projection of the first data connection portion 211 on a base substrate 010 and an orthographic projection of the first scanning line GA1 on the base substrate 010 have an overlapping area, and orthographic projections of the first data line 121 and the first data transmission line 711 on the base substrate 010 are not overlapped with the orthographic projection of the first scanning line GA1 on the base substrate 010. In this way, a facing area between the first scanning line GA1 and the first data line 121 may be avoided. Besides, since the first data connection portion 211 is located in a second conductive layer 200, a distance between the first scanning line GA1 and the first data connection portion 211 may be large, so that lowering of coupling capacitance between the first scanning line GA1 and the first data connection portion 211 may be small, and signal interference may be lowered, thereby improving the display effect.

During specific implementation, in the embodiments of the present disclosure, as shown in FIG. 9A to FIG. 10A, for the first scanning line GA1 and the first data connection portion 211 corresponding to the same row of sub-pixels spx, an orthographic projection of an edge region of the first data connection portion 211 on the base substrate 010 and the orthographic projection of the first scanning line GA1 on the base substrate 010 have an overlapping area. Or, for the first scanning line GA1 and the first data connection portion 211 corresponding to the same row of sub-pixels spx, an orthographic projection of a center region of the first data connection portion 211 on the base substrate 010 and the orthographic projection of the first scanning line GA1 on the base substrate 010 have an overlapping area.

During specific implementation, in the embodiments of the present disclosure, as shown in FIG. 9A to FIG. 10A, a part of rows of sub-pixels spx in rows of first-type sub-pixels spx correspond to two first data connection portions. For example, the $(q+2)^{th}$ row of sub-pixels G(q+2) in FIG. 9*a* and FIG. 9*b* may correspond to two first data connection portions: 211*a* and 211*b*. For the first scanning line GA1, the second scanning line GA2 and the two first data connection portions corresponding to the same row of sub-pixels spx, orthographic projections of the two first data connection portions 211a and 211b on the base substrate 010 and the orthographic projection of the first scanning line GA1 on the base substrate 010 may have an overlapping area, and the orthographic projections of the two first data connection portions 211a and 211b on the base substrate 010 are not overlapped with the orthographic projection of the second scanning line GA2 on the base substrate 010.

During specific implementation, in the embodiments of the present disclosure, as shown in FIG. 9A to FIG. 10A, for the first scanning line GA1, the second scanning line GA2 and the two first data connection portions 211a and 211b corresponding to the same row of sub-pixels spx, an orthographic projection of the first one of the two first data connection portions, namely the first data connection portion 211a, on the base substrate 010 is close to an orthographic projection of a first scanning via hole 811 corresponding to the first scanning line GA1 on the base substrate 010. Exemplarily, compared with the second one of the two first data connection portions, namely the first data connection portion 211b, the orthographic projection of the first one of the two first data connection portions, namely the first data connection portion 211a, on the base substrate 010 may be close to the orthographic projection of the first scanning via hole 811 corresponding to the first scanning line GA1 on the base substrate 010.

During specific implementation, in the embodiments of the present disclosure, as shown in FIG. 9A to FIG. 10A, for the first scanning line GA1, the second scanning line GA2 and the two first data connection portions corresponding to the same row of sub-pixels spx, an orthographic projection of the second one of the two first data connection portions, namely the first data connection portion 211b, on the base substrate 010 is close to an orthographic projection of a second scanning via hole 812 corresponding to the second scanning line GA2 on the base substrate 010. Exemplarily, compared with the first one of the two first data connection portions, namely the first data connection portion 211a, the orthographic projection of the second one of the two first data connection portions, namely the first data connection portion 211b, on the base substrate 010 may be close to the orthographic projection of the second scanning via hole 812 corresponding to the second scanning line GA2 on the base substrate 010.

During specific implementation, in the embodiments of the present disclosure, as shown in FIG. 9A to FIG. 10A, for the first scanning line GA1 and a second data connection portion 212 corresponding to the same row of sub-pixels spx, and a second data line 122 and a second data transmission line 712 electrically connected by means of the second data connection portion 212, an orthographic projection of the second data connection portion 212 on a base substrate 010 and the orthographic projection of the first scanning line GA1 on the base substrate 010 have an overlapping area, and orthographic projections of the second data line 122 and the second data transmission line 712 on the base substrate 010 are not overlapped with the orthographic projection of the first scanning line GA1 on the base substrate 010.

During specific implementation, in the embodiments of the present disclosure, as shown in FIG. 9A to FIG. 10A, for the row of sub-pixels corresponding to the two first data connection portions, the row of sub-pixels further corresponds to one second data connection portion 212. For the first scanning line GA1 and the second data connection portion 212 corresponding to the same row of sub-pixels, and the second data line 122 and the second data transmission line 712 electrically connected by means of the second data connection portion 212, the orthographic projection of the second data connection portion 212 on the base substrate 010 and the orthographic projection of the first scanning line GA1 on the base substrate 010 have an overlapping area, and the orthographic projections of the second data line 122 and the second data transmission line 712 on the base substrate 010 are not overlapped with the orthographic projection of the first scanning line GA1 on the base substrate 010.

Figure 10A:
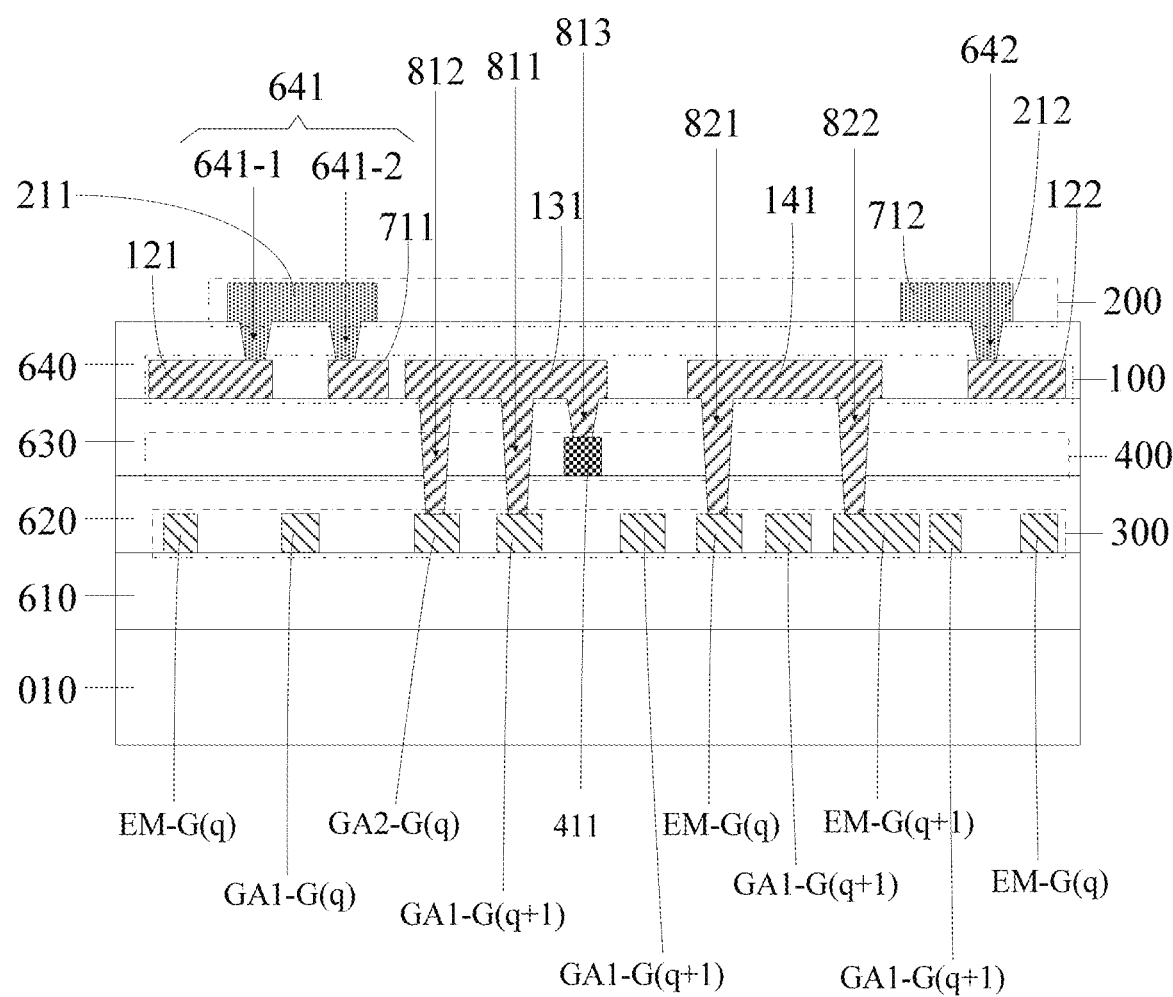
FIG. 10A is a schematic cross-sectional diagram in a direction AA' in the schematic diagram of the layout structure of the local region of the display panels shown in FIG. 9A.
Figure 10B:
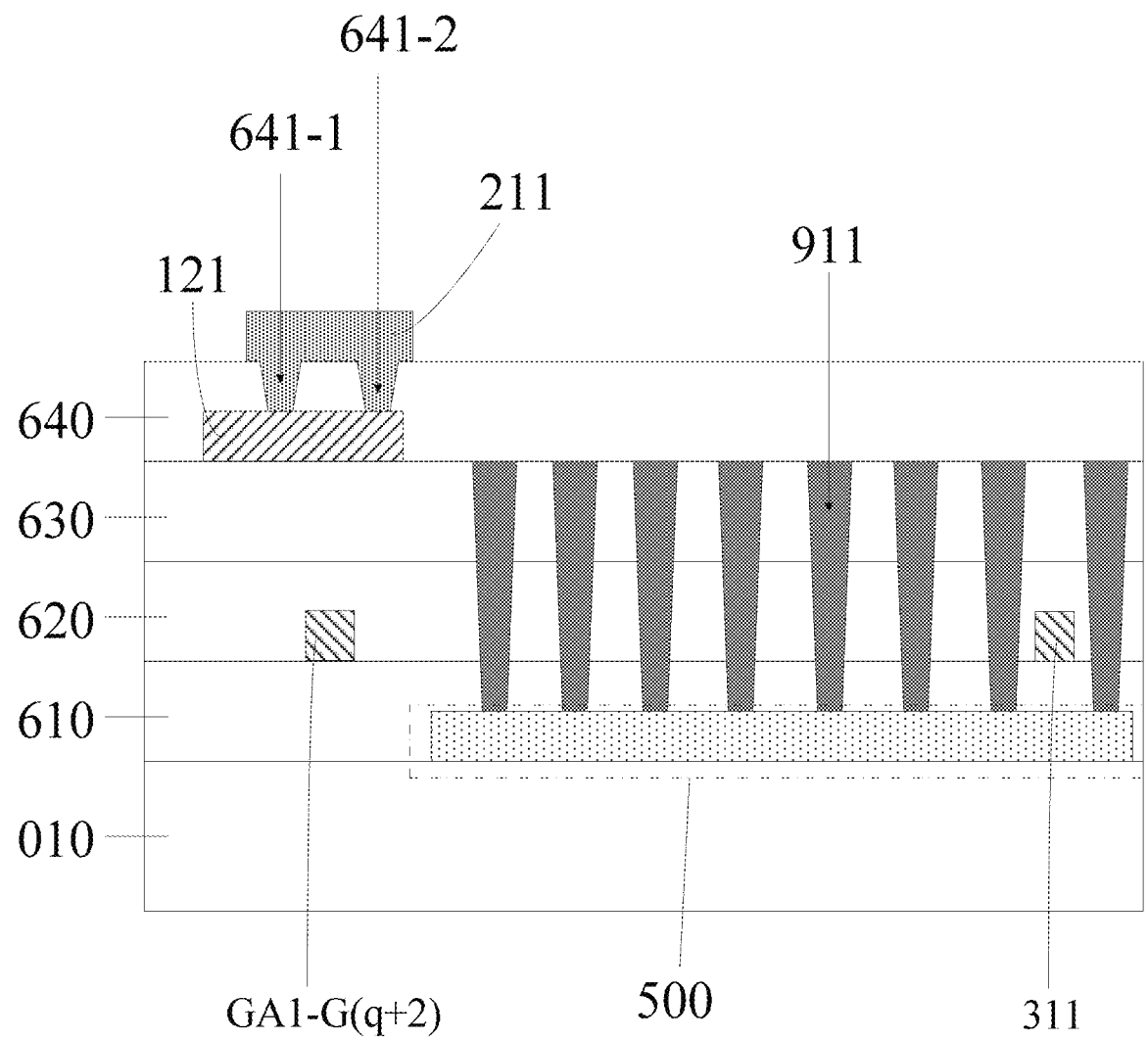
FIG. 10B is a schematic cross-sectional diagram in a direction BB' in the schematic diagram of the layout structure of the local region of the display panels shown in FIG. 9A.
Figure 10C:
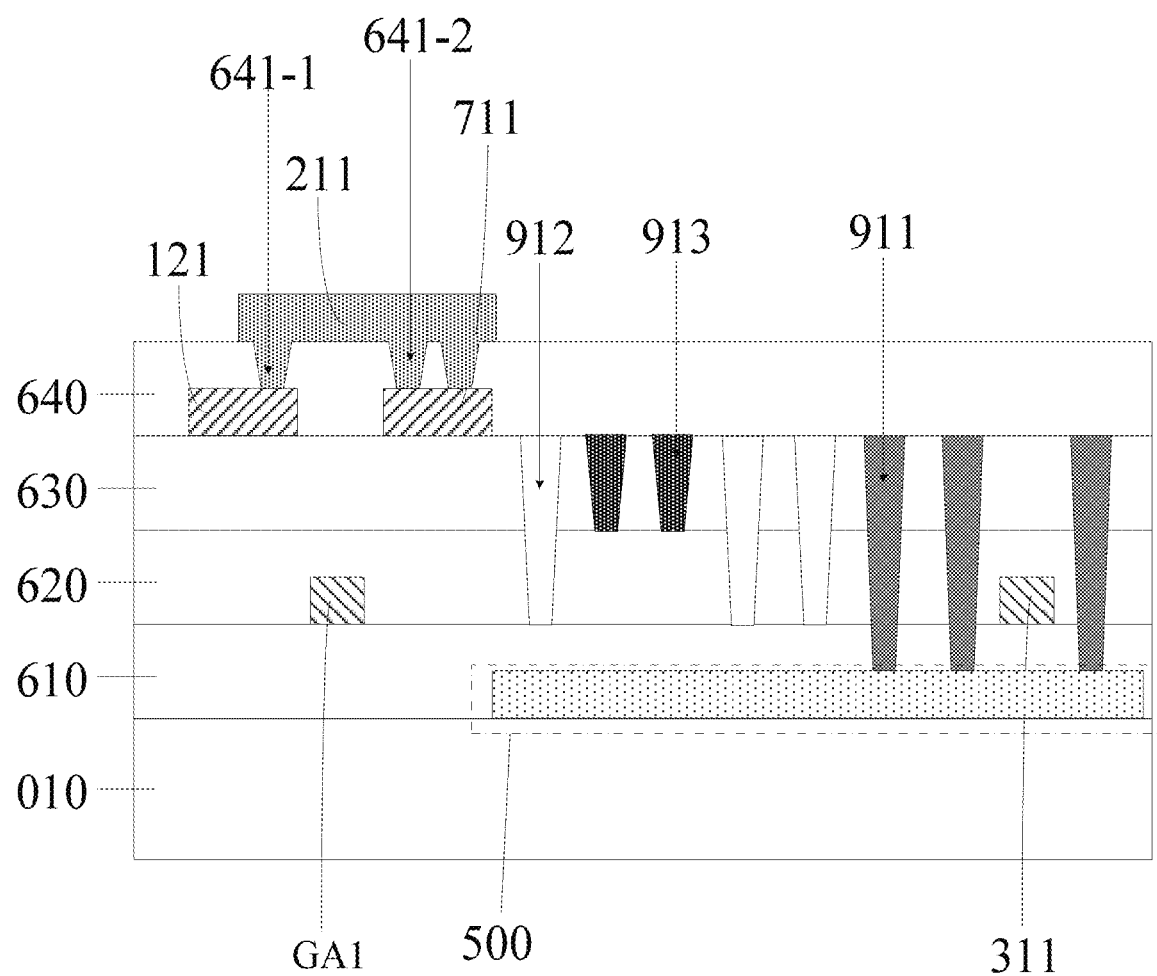
FIG. 10C is a schematic cross-sectional diagram in a direction BB' in the schematic diagram of the layout structure of the local region of the display panels shown in FIG. 9B.

It needs to be noted that, as shown in FIG. 10B and FIG. 10C, a first auxiliary via hole 911, a second auxiliary via hole 912 and a third auxiliary via hole 913 are further disposed in the display panel. Besides, the disposing mode of the first auxiliary via hole 911, the second auxiliary via hole 912 and the third auxiliary via hole 913 can refer to the implementations above, which is omitted here.

Figure 11:
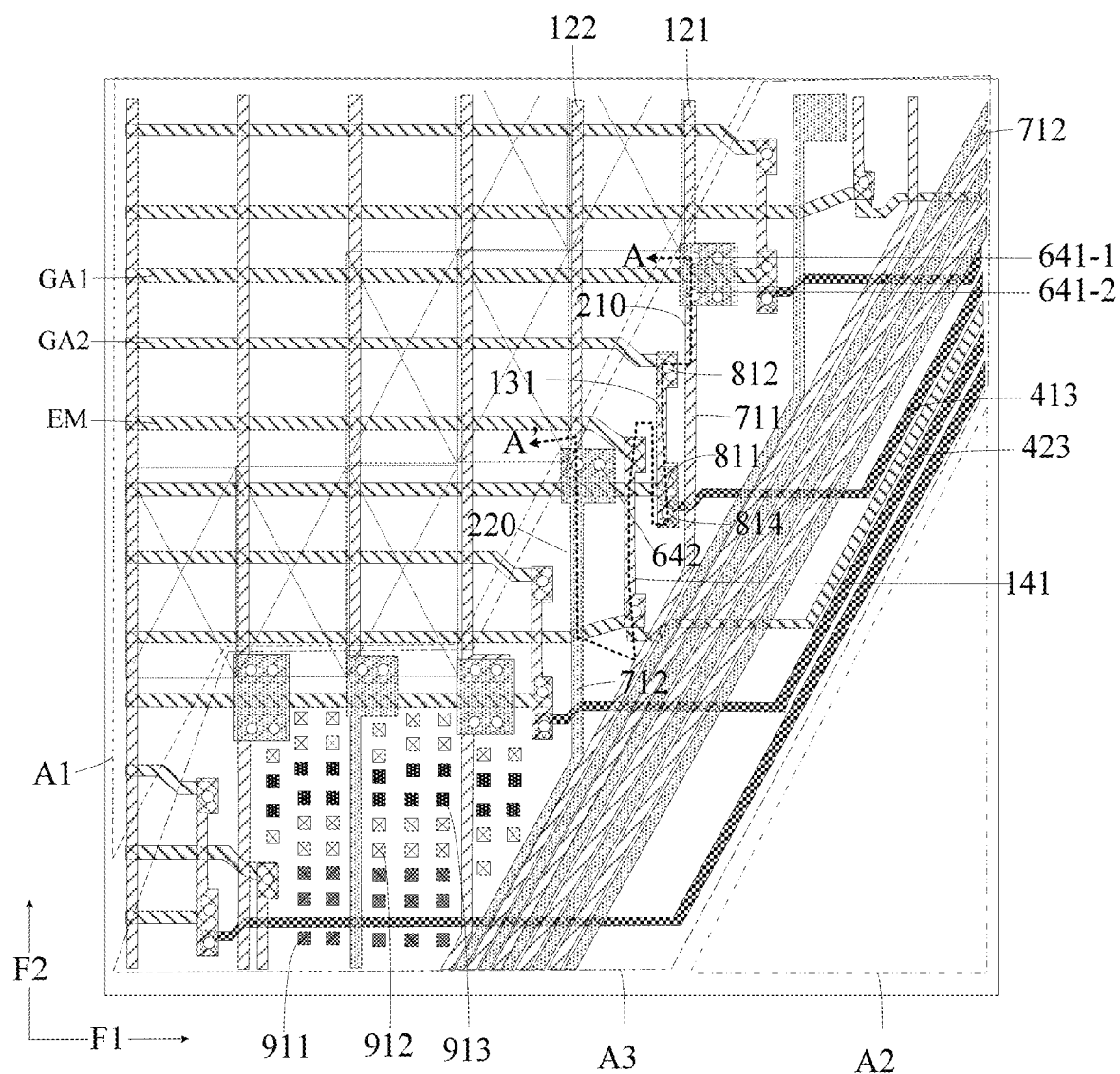
FIG. 11 is a schematic diagram of a layout structure of a local region of further some display panels provided by an embodiment of the present disclosure.
Figure 12:
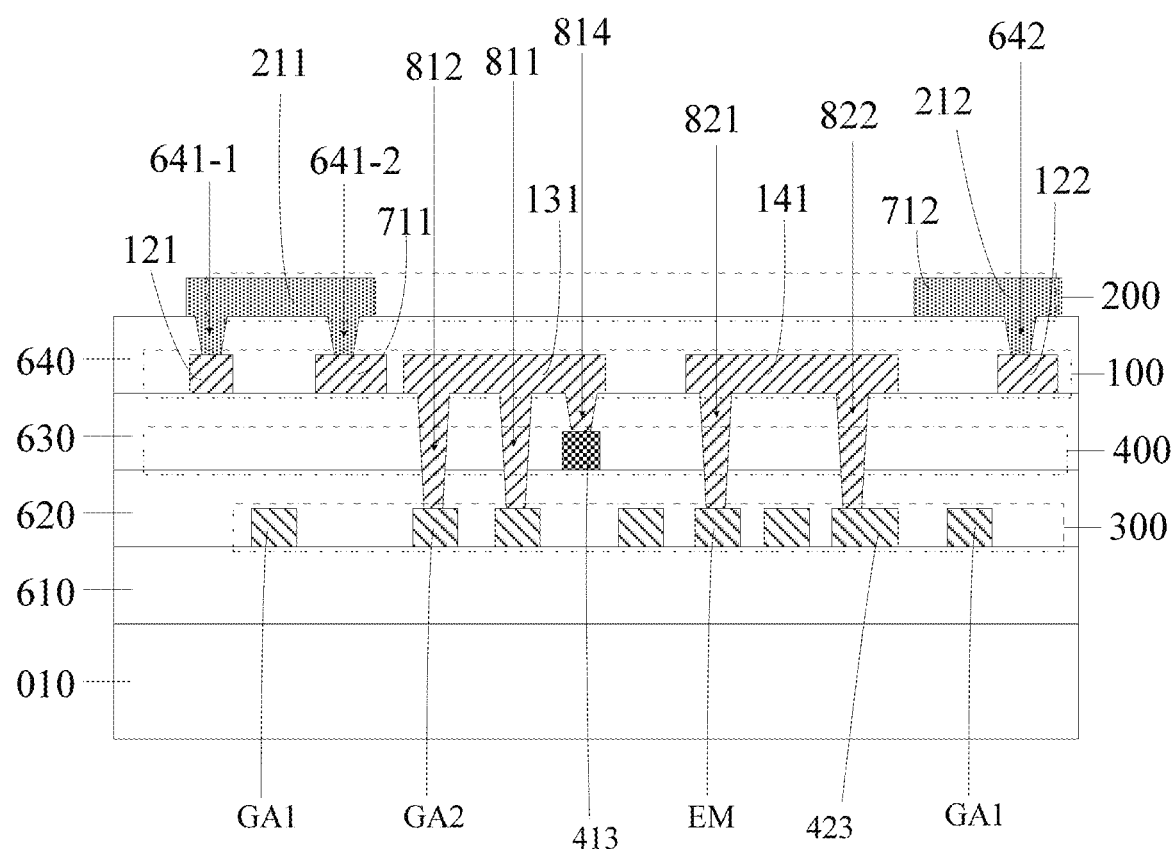
FIG. 12 is a schematic cross-sectional diagram in a direction AA' in the schematic diagram of the layout structure of the local region of the display panels shown in FIG. 11.

An embodiment of the present disclosure further provides further some display panels, as shown in FIG. 11 and FIG. 12, and transformation is performed for a part of the implementations in the above embodiments. Only the difference between the present embodiment and the above embodiments is explained below, and similarities are omitted here.

During specific implementation, in the embodiments of the present disclosure, as shown in FIG. 11 and FIG. 12, a fourth conductive layer 400 may further include a plurality of third scanning transmission lines 413 located in the first non-display region A3. Besides, an interlayer dielectric layer 630 may further include a plurality of fourth scanning via holes 814. First scanning lines GA1 and second scanning lines GA2 electrically connected with each other correspond to one third scanning transmission line 413, and first scanning connection portions 131 are further electrically connected with the third scanning transmission line 413 by means of the fourth scanning via holes 814. A third conductive layer 300 may further include third light emitting transmission lines 423 located in the first non-display region A3. Light emitting control lines electrically connected with each other are directly electrically connected with one third light emitting transmission line 423. In this way, the third light emitting transmission lines 423 may be disposed in the third conductive layer 300, and the third scanning transmission lines 413 are disposed in the fourth conductive layer 400.

Exemplarily, in order to lower signal interference, orthographic projections of the third scanning transmission lines 413 on the base substrate 010 and orthographic projections of the third light emitting transmission lines 423 on the base substrate 010 are not overlapped. Further, the orthographic projections of the third scanning transmission lines 413 on the base substrate 010 and the orthographic projections of the third light emitting transmission lines 423 on the base substrate 010 are disposed at intervals.

Further, in order to lower signal interference, the orthographic projections of the third scanning transmission lines 413 on the base substrate 010 and orthographic projections of second data transmission lines 712 on the base substrate 010 may have an overlapping area. Further, the orthographic projections of the third scanning transmission lines 413 on the base substrate 010 and the orthographic projections of the second data transmission lines 712 on the base substrate 010 may be partially overlapped. Since a third scanning transmission layer is located in the fourth conductive layer 400 and the second data transmission lines 712 are located in the second conductive layer 200, coupling capacitance between the third scanning transmission lines 413 and the second data transmission lines 712 may be lowered, and the occupation area of the first non-display region A3 may further be reduced.

Further, in order to lower signal interference, the orthographic projections of the third light emitting transmission lines 423 on the base substrate 010 and orthographic projections of first data transmission lines 711 on the base substrate 010 may have an overlapping area. Further, the orthographic projections of the third light emitting transmission lines 423 on the base substrate 010 and the orthographic projections of the first data transmission lines 711 on the base substrate 010 may be partially overlapped. Since the third light emitting transmission lines 423 are located in the third conductive layer 300 and the first data transmission lines 711 are located in a first conductive layer 100, coupling capacitance between a third light emitting transmission layer and the first data transmission lines 711 may be lowered, and the occupation area of the first non-display region A3 may further be reduced.

It needs to be noted that the disposing mode of the first auxiliary via hole 911, the second auxiliary via hole 912 and the third auxiliary via hole 913 can refer to the implementations above, which is omitted here.

Figure 13:
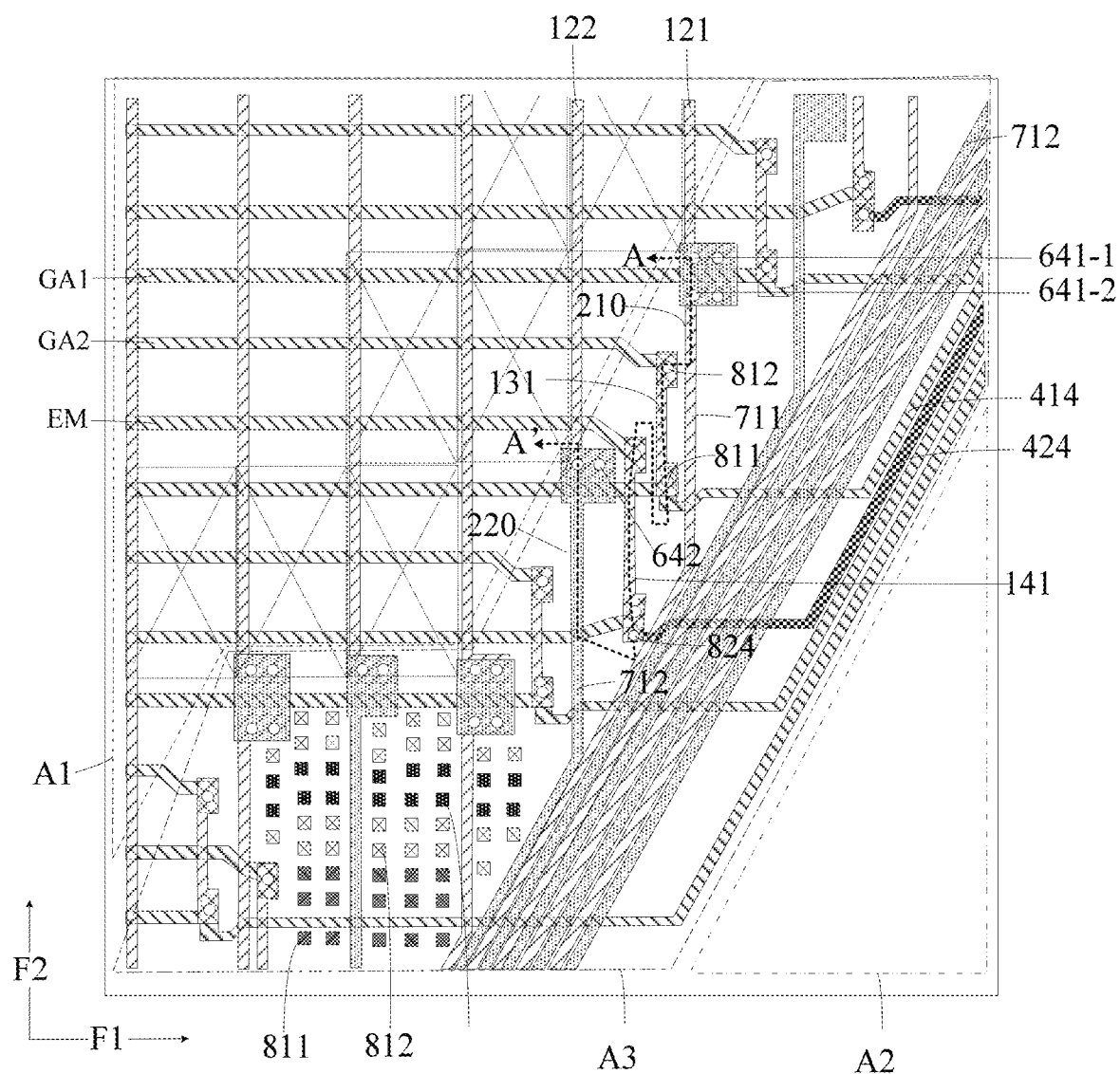
FIG. 13 is a schematic diagram of a layout structure of a local region of further some display panels provided by an embodiment of the present disclosure.
Figure 14:
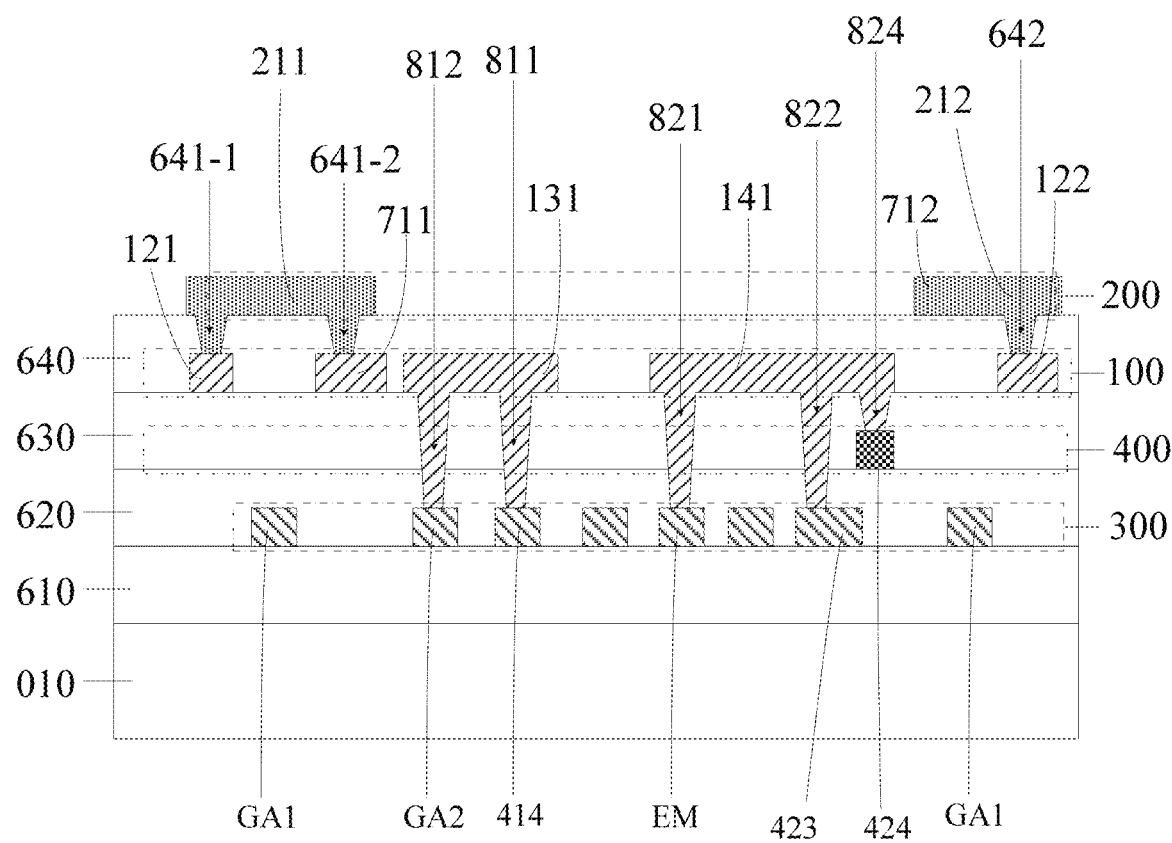
FIG. 14 is a schematic cross-sectional diagram in a direction AA' in the schematic diagram of the layout structure of the local region of the display panels shown in FIG. 13.

An embodiment of the present disclosure further provides further some display panels, as shown in FIG. 13 and FIG. 14, and transformation is performed for a part of the implementations in the above embodiments. Only the difference between the present embodiment and the above embodiments is explained below, and similarities are omitted here.

During specific implementation, in the embodiments of the present disclosure, as shown in FIG. 13 and FIG. 14, a fourth conductive layer 400 may further include a plurality of fourth light emitting transmission lines 424 located in the first non-display region A3. An interlayer dielectric layer 630 may further include a plurality of fourth light emitting via holes 824. Light emitting control lines EM electrically connected with each other correspond to one fourth light emitting transmission line 424. Besides, first light emitting connection portions 141 are further electrically connected with the fourth light emitting transmission lines 424 by means of the fourth light emitting via holes 824. A third conductive layer 300 may further include fourth scanning transmission lines 414 located in the first non-display region A3. First scanning lines GA1 and second scanning lines GA2 electrically connected with each other are directly electrically connected with one fourth scanning transmission line 414. In this way, the fourth scanning transmission lines 414 may be disposed in the third conductive layer 300, and the fourth light emitting transmission lines 424 are disposed in the fourth conductive layer 400.

Exemplarily, in order to lower signal interference, as shown in FIG. 13 and FIG. 14, orthographic projections of the fourth scanning transmission lines 414 on the base substrate 010 and orthographic projections of the fourth light emitting transmission lines 424 on the base substrate 010 are not overlapped. Exemplarily, the orthographic projections of the fourth scanning transmission lines 414 on the base substrate 010 and the orthographic projections of the fourth light emitting transmission lines 424 on the base substrate 010 may be disposed in a spaced mode.

Further, in order to lower signal interference, the orthographic projections of the fourth scanning transmission lines 414 on the base substrate 010 and orthographic projections of first data transmission lines 711 on the base substrate 010 may have an overlapping area. Further, the orthographic projections of the fourth scanning transmission lines 414 on the base substrate 010 and the orthographic projections of the first data transmission lines 711 on the base substrate 010 may be partially overlapped. Since a fourth scanning transmission layer is located in the third conductive layer 300 and the first data transmission lines 711 are located in a first conductive layer 100, coupling capacitance between the fourth scanning transmission layer and the first data transmission lines 711 may be lowered, and the occupation area of the first non-display region A3 may further be reduced.

Further, in order to lower signal interference, the orthographic projections of the fourth light emitting transmission lines 424 on the base substrate 010 and orthographic projections of second data transmission lines 712 on the base substrate 010 may have an overlapping area. Further, the orthographic projections of the fourth light emitting transmission lines 424 on the base substrate 010 and the orthographic projections of the second data transmission lines 712 on the base substrate 010 may be partially overlapped. Since the fourth light emitting transmission lines 424 are located in the fourth conductive layer 400 and the second data transmission lines 712 are located in a second conductive layer 200, coupling capacitance between the fourth light emitting transmission layer and the second data transmission lines 712 may be large, and the occupation area of the first non-display region A3 may further be reduced.

It needs to be noted that the disposing mode of the first auxiliary via hole 911, the second auxiliary via hole 912 and the third auxiliary via hole 913 can refer to the implementations above, which is omitted here.

Based on the same inventive concept, an embodiment of the present disclosure further provides a display device, including the display panel provided by the embodiments of the present disclosure. The principle for solving problems of the display device is similar to that of the aforementioned display panel, and thus the implementation of the display device can refer to the implementation of the aforementioned display panel, and repetitions are omitted here.

During specific implementation, in the embodiments of the present disclosure, the display device may be: a mobile phone, a tablet computer, a television, a display, a laptop, a digital photo frame, a navigator and any product or component with a display function. Other essential components of the display device shall be understood by those of ordinary skill in the art, and is omitted herein and also shall not become a restriction to the present disclosure.

According to the display panel and the display device provided by the embodiments of the present disclosure, first data connection portions are disposed in a second conductive layer, so that data lines and first data transmission lines in a first conductive layer are electrically connected with each other by means of the first data connection portions in the second conductive layer. In this way, the data lines corresponding to the same column of sub-pixels and divided by a notch region may be electrically connected, and the interference of the first data connection portions on a third conductive layer and a fourth conductive layer may also be reduced, so that the signal stability can be improved, and the display effect can be improved.

Although the preferred embodiments of the present disclosure have been described, those skilled in the art can make additional changes and modifications on these embodiments once they know the basic creative concept. So the appended claims are intended to be construed to include the preferred embodiments and all changes and modifications that fall into the scope of the present disclosure.

Apparently, those skilled in the art can make various modifications and variations to the embodiments of the present disclosure without departing from the spirit and scope of the embodiments of the present disclosure. In this way, under the condition that these modifications and variations to the embodiments of the present disclosure fall within the scope of the claims of the present disclosure and their equivalent technologies, the present disclosure is also intended to include these modifications and variations.

What is claimed is:

1. A display panel, comprising:
a base substrate, comprising a notch region, a display region and a first non-display region, the first non-display region being located between the notch region and the display region; wherein the display region comprises a plurality of sub-pixels;
a third conductive layer, located on the base substrate, and comprising a plurality of first scanning lines and a plurality of second scanning lines located in the display region; wherein one row of sub-pixels corresponds to one first scanning line and one second scanning line;
a second insulating layer, located on a side of the third conductive layer facing away from the base substrate;
a first conductive layer, located on a side of the second insulating layer facing away from the base substrate, and comprising a plurality of data lines and a plurality of first data transmission lines;
an interlayer insulating layer, located on a side of the first conductive layer facing away from the base substrate, and having a plurality of first data via holes; and
a second conductive layer, located on a side of the interlayer insulating layer facing away from the base substrate, and comprising a plurality of first data connection portions;
wherein the plurality of data lines are located in the display region, and the plurality of first data transmission lines are located in the first non-display region;
at least one of the plurality of first data connection portions is electrically connected with at least one of the plurality of data lines and at least one of the plurality of first data transmission lines through the plurality of first data via holes;
rows of sub-pixels comprise rows of first-type sub-pixels; at least one row of sub-pixels in the rows of first-type sub-pixels corresponds to the at least one of the plurality of first data connection portions; and
for a first scanning line and a first data connection portion corresponding to a same row of sub-pixels, and a first data line and a first data transmission line electrically connected through the plurality of first data connection portions, orthographic projections of the plurality of first data connection portions on the base substrate and orthographic projections of the plurality of first scanning lines on the base substrate have overlapping areas, and an orthographic projection of the first data line on the base substrate and orthographic projections of the plurality of first data transmission lines on the base substrate are not overlapped with the orthographic projections of the plurality of first scanning lines on the base substrate.

2. The display panel according to claim 1, wherein the second conductive layer further comprises: a plurality of second data transmission lines disposed spaced from the plurality of first data connection portions; the plurality of second data transmission lines are located in the first non-display region;
the interlayer insulating layer further comprises: a plurality of second data via holes; and
the plurality of data lines comprise a plurality of first data lines and a plurality of second data lines;
wherein one first data line is electrically connected with one first data transmission line through the plurality of first data connection portions, and one second data line is electrically connected with one second data transmission line through a second data via hole;
wherein a second scanning line corresponding to a first row of sub-pixels in every two adjacent rows of sub-pixels is electrically connected to a first scanning line corresponding to a second row of sub-pixels in the every two adjacent rows of sub-pixels.

3. The display panel according to claim 2, wherein the first conductive layer further comprises: a plurality of first scanning connection portions insulated from the data lines and the first data transmission lines and disposed at intervals;
wherein the plurality of first scanning lines and the plurality of second scanning lines electrically connected with each other correspond to at least one of the plurality of first scanning connection portions;
the second insulating layer comprises a plurality of first scanning via holes and a plurality of second scanning via holes; and
a first end of a first scanning connection portion is electrically connected to a corresponding first scanning line through at least one of the plurality of first scanning via holes, and a second end of the first scanning connection portion is electrically connected to a corresponding second scanning line through at least one of the plurality of second scanning via holes;
wherein the orthographic projections of the plurality of first data connection portions on the base substrate and orthographic projections of the plurality of first scanning connection portions on the base substrate are not overlapped.

4. The display panel according to claim 3, wherein for a first scanning line, a second scanning line and a first data connection portion corresponding to a same row of sub-pixels, the orthographic projections of the plurality of first data connection portions on the base substrate are located between an orthographic projection of a first scanning via hole corresponding to the first scanning line on the base substrate and an orthographic projection of a second scanning via hole corresponding to the second scanning line on the base substrate;
wherein for the first scanning line, the second scanning line and the first data connection portion corresponding to the same row of sub-pixels, a connection line between a center of the orthographic projection of the first scanning via hole corresponding to the first scanning line on the base substrate and a center of the orthographic projection of the second scanning via hole corresponding to the second scanning line on the base substrate is overlapped with the orthographic projection of the first data connection portion on the base substrate;
wherein for the first scanning line and the first data connection portion corresponding to the same row of sub-pixels, an orthographic projection of a center region of the first data connection portion on the base substrate and the orthographic projection of the first scanning line on the base substrate have an overlapping area.

5. The display panel according to claim 3, wherein a part of rows of sub-pixels in the rows of first-type sub-pixels correspond to two first data connection portions, and for a first scanning line, a second scanning line and the two first data connection portions corresponding to a same row of sub-pixels, orthographic projections of the two first data connection portions on the base substrate and an orthographic projection of the first scanning line on the base substrate have an overlapping area, and the orthographic projections of the two first data connection portions on the base substrate is not overlapped with an orthographic projection of the second scanning line on the base substrate.

6. The display panel according to claim 5, wherein for the first scanning line, the second scanning line and the two first data connection portions corresponding to the same row of sub-pixels,
   an orthographic projection of a first one of the two first data connection portions on the base substrate is close to an orthographic projection of a first scanning via hole corresponding to the first scanning line on the base substrate; and/or,
   an orthographic projection of a second one of the two first data connection portions on the base substrate is close to an orthographic projection of a second scanning via hole corresponding to the second scanning line on the base substrate.

7. The display panel according to claim 3, wherein the second conductive layer further comprises: a plurality of second data connection portions; wherein one second data transmission line is directly electrically connected to at least one of the plurality of second data connection portions, and the plurality of second data connection portions are electrically connected to one second data line through a plurality of second data via holes;
   wherein in a first direction, the first data lines and the second data lines are arranged alternately; and
   projections of the plurality of first data connection portions and the plurality of second data connection portions on a straight line extending in the first direction are arranged alternately.

8. The display panel according to claim 7, wherein the rows of sub-pixels comprise rows of second-type sub-pixels; the rows of second-type sub-pixels are different from the rows of first-type sub-pixels;
   at least one row of sub-pixels in the rows of second-type sub-pixels corresponds to at least one second data connection portion; and
   for a first scanning line and a second data connection portion corresponding to a same row of sub-pixels, and a second data line and a second data transmission line electrically connected through the plurality of second data connection portions, orthographic projections of the plurality of second data connection portions on the base substrate and the orthographic projections of the plurality of first scanning lines on the base substrate have overlapping areas, and an orthographic projection of the second data line on the base substrate and an orthographic projection of the second data transmission line on the base substrate are not overlapped with the orthographic projections of the plurality of first scanning lines on the base substrate.

9. The display panel according to claim 8, wherein for a row of sub-pixels corresponding to two first data connection portions, the row of sub-pixels further corresponds to one second data connection portion; and
   for the plurality of first scanning lines and the plurality of second data connection portions corresponding to the same row of sub-pixels, and the second data line and the plurality of second data transmission lines electrically connected through the plurality of second data connection portions, the orthographic projections of the plurality of second data connection portions on the base substrate and the orthographic projections of the plurality of first scanning lines on the base substrate have overlapping areas, and the orthographic projection of the second data line on the base substrate and an orthographic projection of the second data transmission line on the base substrate are not overlapped with the orthographic projection of the first scanning line on the base substrate.

10. The display panel according to claim 2, wherein the third conductive layer further comprises a plurality of light emitting control lines located in the display region; wherein one row of sub-pixels corresponds to one light emitting control line; light emitting control lines corresponding to two adjacent rows of sub-pixels are electrically connected;
    the display panel further comprises:
    a fourth conductive layer, located between the first conductive layer and the third conductive layer; and
    the second insulating layer comprises:
    a second gate insulating layer, located between the third conductive layer and the fourth conductive layer; and
    an interlayer dielectric layer, located between the fourth conductive layer and the first conductive layer.

11. The display panel according to claim 10, wherein the first conductive layer further comprises: a plurality of first light emitting connection portions insulated from the data lines and the first data transmission lines and disposed at intervals; wherein light emitting control lines electrically connected with each other correspond to at least one of the plurality of first light emitting connection portions;
    the second insulating layer comprises a plurality of first light emitting via holes and a plurality of second light emitting via holes; and
    a first end of a first light emitting connection portion is electrically connected to a corresponding light emitting control line through at least one of the plurality of first light emitting via holes, and a second end of the first light emitting connection portion is electrically connected to an another corresponding light emitting control line through at least one of the plurality of second light emitting via holes.

12. The display panel according to claim 10, wherein the third conductive layer further comprises a plurality of first scanning transmission lines and a plurality of first light emitting transmission lines located in the first non-display region; wherein the first scanning transmission lines and the first light emitting transmission lines are disposed at intervals;
    a part of the first scanning lines and the second scanning lines electrically connected with each other are directly electrically connected with one corresponding first scanning transmission line; a part of light emitting control lines electrically connected with each other are directly electrically connected to one first light emitting transmission line;
    the fourth conductive layer further comprises a plurality of second scanning transmission lines and a plurality of second light emitting transmission lines located in the first non-display region; wherein the second scanning transmission lines and the second light emitting transmission lines are disposed at intervals;
    the interlayer dielectric layer further comprises a plurality of third scanning via holes and a plurality of third light emitting via holes;
    a remaining part of the first scanning lines and the second scanning lines electrically connected with each other correspond to one second scanning transmission line, and the first scanning connection portions are further electrically connected to the second scanning transmission line through the third scanning via holes; and a remaining part of the light emitting control lines electrically connected with each other correspond to one second light emitting transmission line, and the first light emitting connection portions are further electrically connected to the second light emitting transmission line through the third light emitting via holes.

13. The display panel according to claim 10, wherein the fourth conductive layer comprises a plurality of third scanning transmission lines located in the first non-display region;

the interlayer dielectric layer comprises a plurality of fourth scanning via holes;

the first scanning lines and the second scanning lines electrically connected with each other correspond to one third scanning transmission line, and the first scanning connection portions are further electrically connected to the third scanning transmission line through the fourth scanning via holes; and the third conductive layer further comprises third light emitting transmission lines located in the first non-display region; wherein light emitting control lines electrically connected with each other are directly electrically connected with one third light emitting transmission line;

wherein the fourth conductive layer comprises a plurality of fourth light emitting transmission lines located in the first non-display region;

the interlayer dielectric layer comprises a plurality of fourth light emitting via holes;

light emitting control lines electrically connected with each other correspond to one fourth light emitting transmission line, and the first light emitting connection portions are further electrically connected to the fourth light emitting transmission line through the fourth light emitting via holes; and the third conductive layer further comprises fourth scanning transmission lines located in the first non-display region; wherein the first scanning lines and the second scanning lines electrically connected with each other are directly electrically connected to one fourth scanning transmission line.

14. The display panel according to claim 11, wherein for a light emitting control line, a second scanning line and a second data connection portion corresponding to a same row of sub-pixels, an orthographic projection of the second data connection portion on the base substrate is located between an orthographic projection of a second scanning via hole corresponding to the second scanning line on the base substrate and an orthographic projection of a first light emitting via hole corresponding to the light emitting control line on the base substrate.

15. The display panel according to claim 2, further comprising:

a first gate insulating layer, located between the third conductive layer and the base substrate; and a semiconductor layer, located between the first gate insulating layer and the base substrate; wherein at least one of the plurality of sub-pixels comprises: a first connection via hole, a second connection via hole and a third connection via hole; wherein the first connection via hole penetrates through the first gate insulating layer, the second gate insulating layer and the interlayer dielectric layer; the second connection via hole penetrates through the second gate insulating layer and the interlayer dielectric layer; and the third connection via hole penetrates through the interlayer dielectric layer;

the first conductive layer is electrically connected to the semiconductor layer through the first connection via hole;

the first conductive layer is electrically connected to the second conductive layer through the second connection via hole; and the first conductive layer is electrically connected to the third conductive layer through the third connection via hole;

further comprising at least one first auxiliary via hole located in the first non-display region; wherein the first auxiliary via hole penetrates through the first gate insulating layer, the second gate insulating layer and the interlayer dielectric layer, and the first auxiliary via hole is not filled with a conductive material.

16. The display panel according to claim 15, wherein a distribution density of the first auxiliary via hole is smaller than or substantially equal to a distribution density of the first connection via holes;

wherein an orthographic projection of the first auxiliary via hole on the base substrate is not overlapped with orthographic projections of the semiconductor layer, the first conductive layer, the third conductive layer and the fourth conductive layer on the base substrate.

17. The display panel according to claim 15, further comprising at least one second auxiliary via hole located in the first non-display region; wherein the second auxiliary via hole penetrates through the second gate insulating layer and the interlayer dielectric layer, and the second auxiliary via hole is not filled with a conductive material;

wherein a distribution density of the second auxiliary via hole is smaller than or substantially equal to a distribution density of the second connection via holes;

wherein an orthographic projection of the second auxiliary via hole on the base substrate is not overlapped with orthographic projections of the first conductive layer, the third conductive layer and the fourth conductive layer on the base substrate.

18. The display panel according to claim 15, further comprising at least one third auxiliary via hole located in the first non-display region; wherein the third auxiliary via hole penetrates through the interlayer dielectric layer, and the third auxiliary via hole is not filled with a conductive material.

19. The display panel according to claim 18, wherein a distribution density of the third auxiliary via hole is smaller than or substantially equal to a distribution density of the third connection via holes;

wherein an orthographic projection of the third auxiliary via hole on the base substrate is not overlapped with orthographic projections of the first conductive layer and the fourth conductive layer on the base substrate.

20. A display device, comprising a display panel, wherein the display panel comprises:

a base substrate, comprising a notch region, a display region and a first non-display region, the first non-display region being located between the notch region and the display region; wherein the display region comprises a plurality of sub-pixels;

a third conductive layer, located on the base substrate, and comprising a plurality of first scanning lines and a plurality of second scanning lines located in the display region; wherein one row of sub-pixels corresponds to one first scanning line and one second scanning line;

a second insulating layer, located on a side of the third conductive layer facing away from the base substrate;

a first conductive layer, located on a side of the second insulating layer facing away from the base substrate, and comprising a plurality of data lines and a plurality of first data transmission lines;

an interlayer insulating layer, located on a side of the first conductive layer facing away from the base substrate, and having a plurality of first data via holes; and a second conductive layer, located on a side of the interlayer insulating layer facing away from the base substrate, and comprising a plurality of first data connection portions;

wherein the plurality of data lines are located in the display region, and the plurality of first data transmission lines are located in the first non-display region;

at least one of the plurality of first data connection portions is electrically connected with at least one of the plurality of data lines and at least one of the plurality of first data transmission lines through the first data via holes;

rows of sub-pixels comprise rows of first-type sub-pixels; at least one row of sub-pixels in the rows of first-type sub-pixels corresponds to the at least one of the plurality of first data connection portions; and for a first scanning line and a first data connection portion corresponding to a same row of sub-pixels, and a first data line and a first data transmission line electrically connected through the first data connection portion, an orthographic projection of the first data connection portion on the base substrate and an orthographic projection of the first scanning line on the base substrate have an overlapping area, and an orthographic projection of the first data line on the base substrate and an orthographic projection of the first data transmission line on the base substrate are not overlapped with the orthographic projection of the first scanning line on the base substrate.

\* \* \* \* \*